US 12,149,208 B2

(12) United States Patent
Yeo et al.

(10) Patent No.: US 12,149,208 B2
(45) Date of Patent: Nov. 19, 2024

(54) ELECTRONIC CIRCUIT AND POWER AMPLIFIER COMPRISING SAME

(71) Applicants: SAMSUNG ELECTRONICS CO., LTD., Suwon-si (KR); KOREA ADVANCED INSTITUTE OF SCIENCE AND TECHNOLOGY, Daejeon (KR)

(72) Inventors: Sungku Yeo, Suwon-si (KR); Seunghun Wang, Daejeon (KR); Songcheol Hong, Daejeon (KR); Jaeseok Park, Suwon-si (KR); Jinseok Park, Daejeon (KR); Chongmin Lee, Suwon-si (KR)

(73) Assignees: Samsung Electronics Co., Ltd., Suwon-si (KR); Korea Advanced Institute of Science and Technology, Daejeon (KR)

( * ) Notice: Subject to any disclaimer, the term of this patent is extended or adjusted under 35 U.S.C. 154(b) by 591 days.

(21) Appl. No.: 17/430,173

(22) PCT Filed: Feb. 11, 2020

(86) PCT No.: PCT/KR2020/001903
§ 371 (c)(1),
(2) Date: Aug. 11, 2021

(87) PCT Pub. No.: WO2020/166938
PCT Pub. Date: Aug. 20, 2020

(65) Prior Publication Data
US 2022/0158588 A1    May 19, 2022

(30) Foreign Application Priority Data
Feb. 11, 2019  (KR) .................. 10-2019-0015701

(51) Int. Cl.
*H03F 1/14*   (2006.01)
*H03F 1/02*   (2006.01)
(Continued)

(52) U.S. Cl.
CPC .......... *H03F 1/0205* (2013.01); *H03F 3/211* (2013.01); *H03F 3/72* (2013.01); *H03F 2200/451* (2013.01)

(58) Field of Classification Search
CPC .. H03F 1/0205; H03F 3/211; H03F 2200/451; H03F 3/195; H03F 3/68;
(Continued)

(56) References Cited

U.S. PATENT DOCUMENTS 8,217,722 B2 *  7/2012  Yamamoto .............. H03F 3/72
                                                     330/296
8,232,808 B2 *  7/2012  Kimura ................ H03K 17/56
                                                     324/629
(Continued)

FOREIGN PATENT DOCUMENTS

JP      09-008501    1/1997
JP      2007-129571  5/2007
(Continued)

OTHER PUBLICATIONS

International Search Report for PCT/KR2020/001903 dated May 19, 2020, 5 pages.
(Continued)

*Primary Examiner* — Khanh V Nguyen
(74) *Attorney, Agent, or Firm* — Nixon & Vanderhye P.C.

(57) ABSTRACT

An electronic circuit according to various embodiments may comprise: a switch circuit, wherein the switch circuit may comprise: a first switch connected to a first port and a second switch connected to a second port, the first and second switches being connected in series with each other; a first (Continued)

parallel switch connected to a node between the first switch and the second switch; and a first shunt inductor connected to the node between the first switch and the second switch and configured to cancel a parasitic capacitance component of the first parallel switch.

13 Claims, 17 Drawing Sheets

(51) Int. Cl.
*H03F 3/21* (2006.01)
*H03F 3/72* (2006.01)

(58) Field of Classification Search
CPC ...... H03F 3/72; H03F 1/0277; H03F 3/45188; H03F 1/565; H03F 1/0211; H03K 17/687; H03K 17/693; H03K 17/6871; H03G 1/0088
USPC .......................................................... 330/51
See application file for complete search history.

(56) References Cited

U.S. PATENT DOCUMENTS

| | | | |
|---|---|---|---|
| 9,479,126 B2* | 10/2016 | Ilkov | ................. H03F 1/565 |
| 9,479,160 B2* | 10/2016 | Srihari | ............... H03K 17/687 |
| 10,110,259 B1 | 10/2018 | Jo et al. | |
| 2007/0103252 A1 | 5/2007 | Nakatsuka et al. | |
| 2009/0207764 A1* | 8/2009 | Fukamachi | .......... H04B 1/0057 |
| | | | 455/78 |
| 2011/0140764 A1 | 6/2011 | Shin et al. | |
| 2012/0051409 A1 | 3/2012 | Brobston et al. | |
| 2012/0268205 A1 | 10/2012 | Presti | |
| 2016/0028353 A1 | 1/2016 | Thompson et al. | |
| 2020/0373947 A1* | 11/2020 | Beppu | ..................... H03F 3/19 |

FOREIGN PATENT DOCUMENTS

| | | |
|---|---|---|
| KR | 10-2012-0024486 | 3/2012 |
| KR | 10-1301209 | 8/2013 |
| KR | 10-2014-0011393 | 1/2014 |
| KR | 10-2014-0086487 | 7/2014 |
| KR | 10-2015-0127005 | 11/2015 |
| KR | 10-1912288 | 10/2018 |
| WO | 2015/179879 | 11/2015 |

OTHER PUBLICATIONS

Written Opinion of the ISA for PCT/KR2020/001903 dated May 19, 2020, 6 pages.
Korean Office Action issued Apr. 18, 2023 in corresponding Korean Patent Application No. 10-2019-00155701.

* cited by examiner

| | Switch ON | Switch OFF |
|---|---|---|
| ■ | VDD | 0V |
| □ | 0V | VDD |

ELECTRONIC CIRCUIT AND POWER AMPLIFIER COMPRISING SAME

CROSS-REFERENCE TO RELATED APPLICATIONS

This application is a national stage of International Application No. PCT/KR2020/001903 designating the United States, filed on Feb. 11, 2020, in the Korean Intellectual Property Receiving Office and claiming priority to Korean Patent Application No. 10-2019-0015701, filed on Feb. 11, 2019 in the Korean Intellectual Property Office, the disclosures of which are incorporated by reference herein in their entireties.

BACKGROUND

Field

The disclosure relates to an electronic circuit and a power amplifier including the same.

Description of Related Art

Recently, as radio frequency (RF) beamforming technology has been applied to $5^{th}$-generation (5G) mobile communication, RF wireless power transmission, etc., an RF array including a plurality of channels rather than a single channel is used. An RF array system including a plurality of channels uses several power amplifiers, and power consumed in an RF front-end significantly increases when compared to a system including a single channel A block that consumes the highest power in the RF front-end is a power amplifier. Thus, in application of RF beamforming technology, improvement of the efficiency of the power amplifier the block may be one way to effectively improve the efficiency of the entire system because the block consuming the highest power is the power amplifier.

Generally, a power amplifier having a saturation power Psat consumes high power due to a large size of a transistor included in the power amplifier. Moreover, the power amplifier considers performance at the saturation power important, such that a load impedance is designed as an optimum load impedance that is low suitably for the performance at the saturation power and efficiency at a low output power may not be good.

A phased array for beamforming may not use a saturation power in all channels to reduce a side-lobe component. In this case, in a channel that does not use a saturation power, the energy efficiency of the entire beamforming system may be improved by increasing the efficiency of the power amplifier at the time of using the low output power.

When the low output power is used, a power amplifier operating in a dual power mode including a high power mode and a low power mode may be used to increase the efficiency of the power amplifier. The power amplifier operating in the dual power mode uses an additional switch to increase power efficiency in the low power mode.

However, the power amplifier operating in the existing dual power mode loses efficiency or gain in the high power mode. In addition, the power amplifier capable of operating in the existing dual power mode may have a difficulty in securing isolation or being used in a feedback path of the power amplifier.

SUMMARY

Embodiments of the disclosure provide an electronic circuit including a switch having a series-shunt-series structure.

Embodiments of the disclosure provide a power amplifier that is capable of securing isolation, being used in a feedback path of the power amplifier, and improving power efficiency using a switch having a series-shunt-series structure as a bypass switch of the power amplifier.

An electronic circuit according to various example embodiments includes: a switch circuit including a first switch connected to a first port and a second switch connected to a second port, the first switch and the second switch being serially connected to each other, a first parallel switch connected to a node between the first switch and the second switch, and a first shunt inductor connected to the node between the first switch and the second switch and configured to offset a parasitic capacitance component of the first parallel switch.

A power amplifier according to various example embodiments includes: a first amplifier and a second amplifier including a switch circuit, wherein the second amplifier is configured to amplify a signal output from the first amplifier through the switch circuit in a first power mode of the power amplifier and to bypass the signal output from the first amplifier through the switch circuit in a second power mode of the power amplifier, the switch circuit including a first switch connected to a first input terminal of the second amplifier and a second switch connected to a first output terminal of the second amplifier, the first switch and the second switch being serially connected to each other, a first parallel switch connected to a node between the first switch and the second switch, and a first shunt inductor connected to the node between the first switch and the second switch and configured to offset a parasitic capacitance component of the first parallel switch.

An electronic circuit according to various example embodiments of the present disclosure may improve the efficiency of a power amplifier operating in a dual power mode through a switch having a series-shunt-series structure.

An electronic circuit according to various example embodiments of the present disclosure may improve the efficiency of a power amplifier for a channel requiring a low power output as in a beamforming array, through a switch having a series-shunt-series structure.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
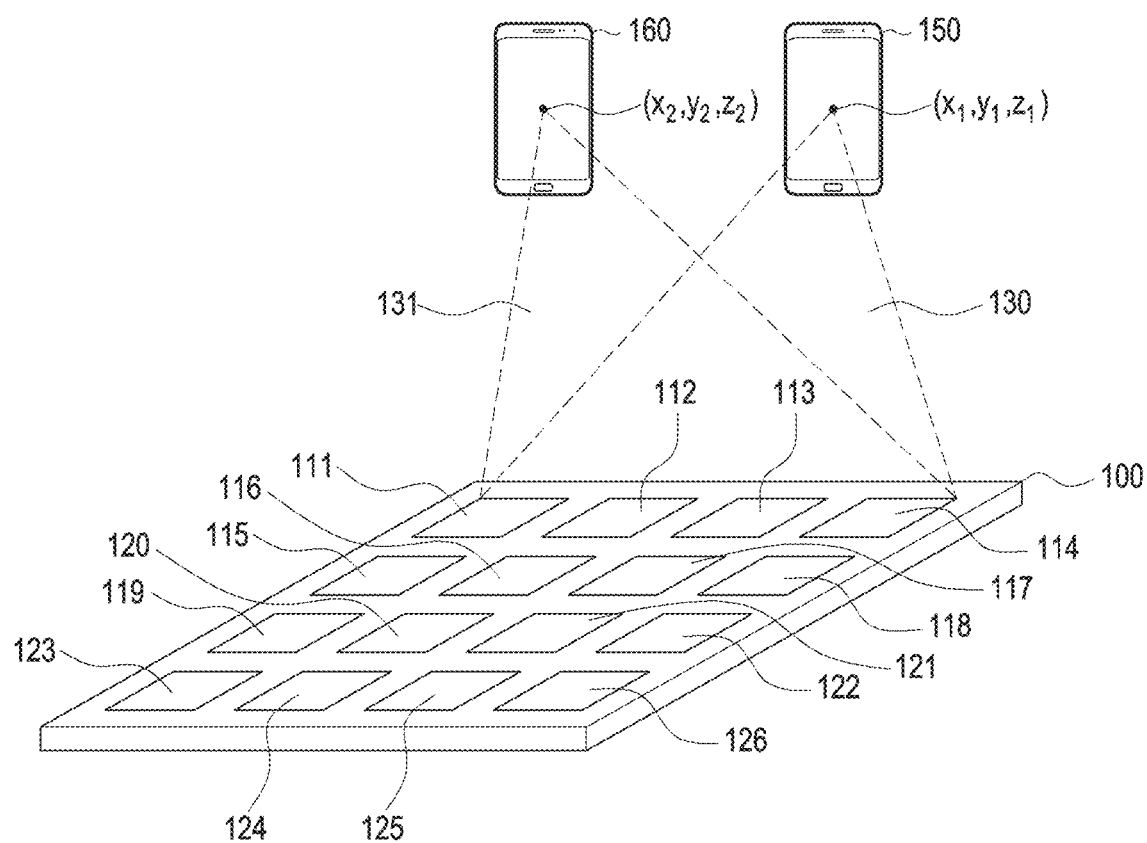
FIG. 1 is a diagram illustrating an example wireless power transmission system according to various embodiments.

FIG. 1 is a diagram illustrating an example wireless power transmission system according to various embodiments.

A wireless power transmission apparatus 100 may wirelessly transmit power to at least one electronic device 150. According to various embodiments of the present disclosure, the wireless power transmission apparatus 100 may include a plurality of patch antennas 111 through 126. The plurality of patch antennas 111 through 126 are not limited as long as each of them is an antenna capable of generating radio frequency (RF) waves. For example, the plurality of patch antennas 111 through 126 may be implemented with a plurality of patch antennas arranged on the same plane as shown in FIG. 1, but they may also be implemented with a plurality of patch antennas of various array forms and numbers without being limited to the shown array form, number, and type, and may be implemented with a plurality of dipole antennas, a plurality of monopole antennas, a plurality of parabola antennas, etc. At least one of the amplitude and phase of RF waves generated by the plurality of patch antennas 111 through 126 may be adjusted by the wireless power transmission apparatus 100. For ease of description, the RF waves respectively generated by the patch antennas 111 to 126 are denoted sub-RF waves.

According to various embodiments of the present disclosure, the wireless power transmission apparatus 100 may adjust at least one of the amplitude and phase of each of the sub-RF waves generated by the patch antennas 111 through 126. The sub-RF waves may interfere with one another. For example, the sub-RF waves may constructively interfere with one another at one point or destructively interfere at another point. The wireless power transmission apparatus 100 according to various embodiments of the present disclosure may adjust at least one of the amplitude and phase of each of the sub-RF waves generated by the patch antennas 111 through 126 so that the sub-RF waves may constructively interfere with one another at a first point $(x_1, y_1, z_1)$.

For example, the wireless power transmission apparatus 100 may determine that an electronic device 150 is positioned at the first point $(x_1, y_1, z_1)$. Here, the position of the electronic device 150 may be the position where, e.g., a power receiving antenna of the electronic device 150 is located. A configuration in which the wireless power transmission apparatus 100 determines the position of the electronic device 150 is described below in greater detail. In order for the electronic device 150 to wirelessly receive power at a higher transmission efficiency, the sub-RF waves should constructively interfere with one another at the first point $(x_1, y_1, z_1)$. Accordingly, the wireless power transmission apparatus 100 may control the patch antennas 111 through 126 so that the sub-RF waves may constructively interfere with one another at the first point $(x_1, y_1, z_1)$. Here, controlling the patch antennas 111 through 126 may refer, for example, to controlling the magnitude of signals inputted to the patch antennas 111 through 126 or controlling the phase (or delay) of signals inputted to the patch antennas 111 through 126. Beamforming, a technique for controlling RF waves to be subject to constructive interference at a certain point, would readily be appreciated by one of ordinary skill in the art. The beamforming used herein is not particularly limited in type. For example, various beamforming methods may be adopted as disclosed in U.S. Patent Application Publication No. 2016/0099611, U.S. Patent Application Publication No. 2016/0099755, and U.S. Patent Application Publication No. 2016/0100124, the disclosures of which are incorporated by reference herein. An RF wave formed by beamforming may be denoted a pocket of energy.

An RF wave 130 formed by the sub-RF waves may have the maximum amplitude at the first point $(x_1, y_1, z_1)$, and thus, the electronic device 150 may receive power at a higher efficiency. The wireless power transmission apparatus 100 may detect that an electronic device 160 is positioned at a second point $(x_2, y_2, z_2)$. The wireless power transmission apparatus 100 may control the patch antennas 111 through 126 so that the sub-RF waves may constructively interfere with one another at the second point $(x_2, y_2, z_2)$ in order to charge the electronic device 160. Hence, a RF wave 131 formed by the sub-RF waves may have the maximum amplitude at the second point $(x_2, y_2, z_2)$, and thus, the electronic device 160 may receive power at a higher efficiency.

For example, the electronic device 150 may be positioned relatively at the right side. In this case, the wireless power transmission apparatus 100 may apply a relatively larger delay to sub-RF waves formed by the patch antennas (e.g., 114, 118, 122, and 126) positioned relatively at the right side. In other words, the elapse of a predetermined time after the sub-RF waves are formed by patch antennas (e.g., 111, 115, 119, and 123) positioned relatively at a left side, sub-RF waves may be generated by the patch antennas (e.g., 114, 118, 122, and 126) positioned relatively at the right side. Thus, the sub-RF waves may simultaneously meet at a relatively right-side point. In other words, the sub-RF waves may constructively interfere with one another at the relatively right-side point. When beamforming is conducted at a relatively middle point, the wireless power transmission apparatus 100 may apply substantially the same delay to the left-side patch antennas (e.g., 111, 115, 119, and 123) and the right-side patch antennas (e.g., 114, 118, 122, and 126).

When beamforming is conducted at a relatively left-side point, the wireless power transmission apparatus 100 may apply substantially a lager delay to the left-side patch antennas (e.g., 111, 115, 119, and 123) than to the right-side patch antennas (e.g., 114, 118, 122, and 126). According to an embodiment, the wireless power transmission apparatus 100 may substantially simultaneously generate sub-RF waves through all of the patch antennas 111 through 126 and may perform beamforming by adjusting the phase corresponding to the above-described delay.

Figure 2:
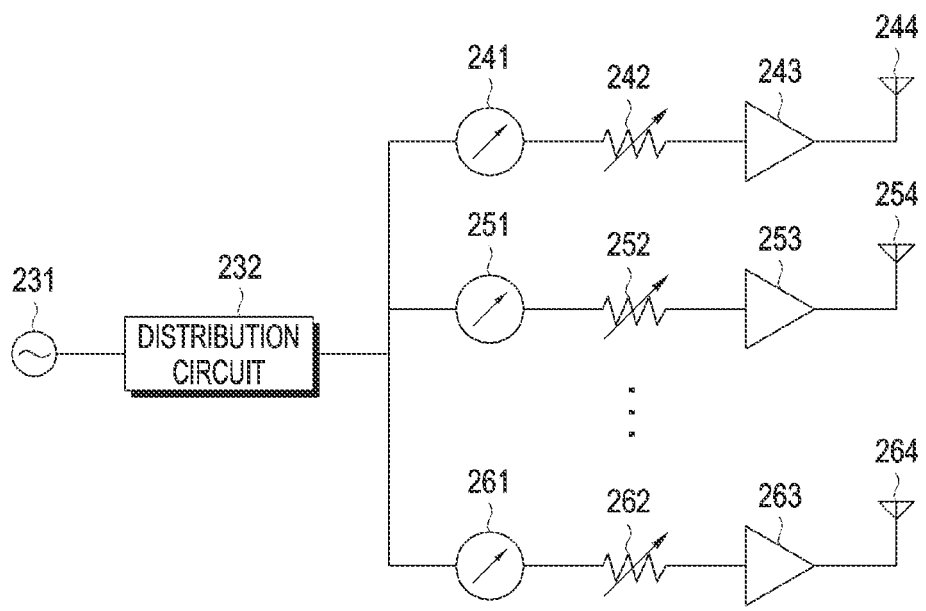
FIG. 2 is a diagram illustrating a single power source, a control device, and an antenna, according to various embodiments.

FIG. 2 is a diagram illustrating an example single power source, a control device, and an antenna, according to various embodiments.

A wireless power transmission apparatus according to various embodiments may include a single power source 231, a distribution circuit 232, a first phase shifter 241, a first attenuator 242, a first amplifier 243, a first antenna 244, a second phase shifter 251, a second attenuator 252, a second amplifier 253, a second antenna 254, a third phase shifter 261, a third attenuator 262, a third amplifier 263, and a third antenna 264. The distribution circuit 232 may distribute an electrical signal output from the single power source 231 to deliver the same to the first phase shifter 241, the second phase shifter 251, and the third phase shifter 261. Thus, synchronized electrical signals may be input to the first phase shifter 241, the second phase shifter 251, and the third phase shifter 261, and an RF wave that is beam-formed via the first antenna 244, the second antenna 254, and the third antenna 264 may be formed according to phase adjustment of each phase shifter.

Figure 3A:
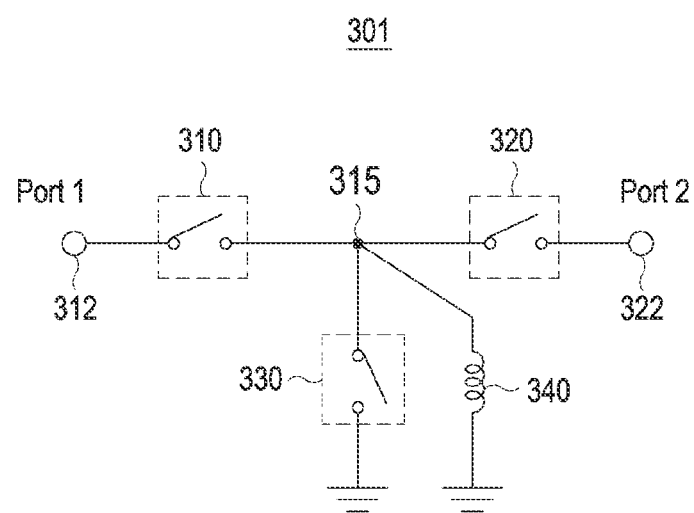
FIG. 3A is a diagram illustrating an example switch circuit according to various embodiments.

FIG. 3A is a diagram illustrating an example switch circuit according to various embodiments.

Referring to FIG. 3A, a switch circuit 301 may include a first switch 310, a second switch 320, a first port 312, a second port 322, a shunt switch 330, and a shunt inductor 340.

According to various embodiments, the switch circuit 301 may be a switch circuit having a series-shunt-series structure.

According to various embodiments, the switch circuit 301 may be applied to $5^{th}$-generation (5G) mobile communication technology or wireless power transmission technology.

According to various embodiments, the switch circuit 301 may be included in the wireless power transmission apparatus 100 of FIG. 1. For example, the switch circuit 301 may be included in at least one amplifier of the wireless power transmission apparatus 100 of FIG. 1. The switch circuit 301 may be included in the first amplifier 243, the second amplifier 253, and the third amplifier 263 of FIG. 2.

According to various embodiments, the switch circuit 301 may be included in an electronic device (e.g., the electronic device 150 and/or 160 of FIG. 1). For example, the switch circuit 301 may be included in an amplifier that amplifies a signal to use beamforming technology applied to mobile communication technology (e.g., 5G mobile communication technology).

According to various embodiments, the first port 312 may be an input port to which a signal is input. The second port 322 may be an output port through which a signal is output.

According to various embodiments, the first switch 310 may connect the first port 312 with the second switch 320. For example, a terminal of the first switch 310 may be connected to the first port 312, and the other terminal of the first switch 310 may be connected to the second switch 320. According to a switch-on/off state of the switch circuit 301, the first switch 310 may be short-circuited or opened. For example, a state where the first switch 310 is short-circuited may be a state where the first switch 310 is turned on, and a state where the first switch 310 is opened may be a state where the first switch 310 is turned off.

According to various embodiments, the second switch 320 may connect the first switch 310 with the second port 322. For example, a terminal of the second switch 320 may be connected to the first switch 310, and the other terminal of the second switch 320 may be connected to the second port 322. Depending on a switch-on/off state of the switch circuit 301, the second switch 320 may be short-circuited or opened. For example, a state where the second switch 320 is short-circuited may be a state where the second switch 320 is turned on, and a state where the second switch 320 is opened may be a state where the second switch 320 is turned off.

According to various embodiments, the first switch 310 and the second switch 320 may be serially connected with each other.

According to various embodiments, the first switch 310 and the second switch 320 may include, for example, and without limitation, a metal-oxide semiconductor (MOS) transistor. For example, the first switch 310 and the second switch 320 may include, for example, and without limitation, an n-channel MOS (NMOS) transistor.

According to various embodiments, the shunt switch 330 may be connected to a node 315 between the first switch 310 and the second switch 320. For example, the shunt switch 330 may be connected to the node 315 between the first switch 310 and the second switch 320. For example, the shunt switch 330 may be implemented as a parallel switch. For example, a terminal of the shunt switch 330 may be connected to the node 315, and the other terminal of the shunt switch 330 may be connected to the ground. Depending on a switch-on/off state of the switch circuit 301, the shunt switch 330 may be short-circuited or opened. For example, a state where the shunt switch 330 is short-circuited may be a state where the shunt switch 330 is turned on, and a state where the shunt switch 330 is opened may be a state where the shunt switch 330 is turned off.

According to various embodiments, the shunt switch 330 may include, for example, and without limitation, a MOS transistor. For example, the shunt switch 330 may include, for example, and without limitation, a p-channel MOS (PMOS) transistor.

According to various embodiments, the shunt inductor 340 may be connected to a node 315 between the first switch 310 and the second switch 320. For example, a terminal of the shunt inductor 340 may be connected to the node 315, and the other terminal of the shunt inductor 340 may be connected to the ground. The shunt inductor 340 may include an inductor.

According to various embodiments, the shunt inductor 340 may offset a parasitic capacitance component of the shunt switch 330. For example, an inductance value of the shunt inductor 340 may be adjusted or determined to offset the parasitic capacitance component of the shunt switch 330.

According to various embodiments, in a switch-off state of the switch circuit 301, a parasitic capacitances of the first switch 310 and the second switch 320 that are serially connected with each other may occur (or appear). However, the shunt switch 330 connected to the node 315 is connected to the ground to make an RF short-circuit state, such that isolation between the first port 312 and the second port 322 may be secured. For example, the switch circuit 301 may shift the burden of offsetting the parasitic capacitances to the shunt switch 330 from the first switch 310 and the second switch 320. In this way, the switch circuit 301 may maintain high impedance appearing from each port in isolation, insertion loss, and the switch-off state, thereby avoiding affecting other circuits connected to the first port 312 and the second port 322.

According to various embodiments, using two switches that are serially connected to each other, insertion loss may increase in the switch-on state of the switch circuit 301, but in case of high-power driving, serial switches may be used by being series-stacked in several stages due to the breakdown issue of a transistor, such that the insertion loss may not be added in case of high-power driving.

Figure 3B:
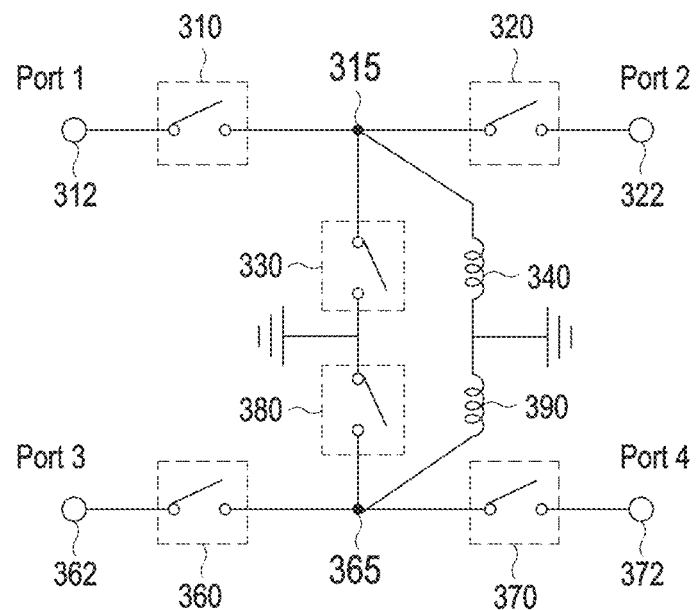
FIG. 3B is a diagram illustrating an example switch circuit of a differential type, according to various embodiments.

FIG. 3B is a diagram illustrating an example switch circuit of a differential type, according to various embodiments.

Referring to FIG. 3B, a switch circuit 302 may include the first switch 310, the second switch 320, the first port 312, the second port 322, the first shunt switch 330, the first shunt inductor 340, a third switch 360, a fourth switch 370, a third port 362, a fourth port 372, a second shunt switch 380, and a second shunt inductor 390.

According to various embodiments, the switch circuit 302 may be a switch circuit having a series-shunt-series structure of a differential type.

According to various embodiments, the first port 312 and the third port 362 may be input ports to which a signal is input. The second port 322 and the fourth port 372 may be output ports through which a signal is output. For example, the switch circuit 302 may include two input ports and two output ports.

According to various embodiments, the shunt switch 302 may be a circuit of a differential type. For example, the switch circuit 302 of FIG. 3B may perform the same or similar function as the switch circuit 301 of FIG. 3A except for the number of input ports and the number of output ports. Thus, the switch circuit 302 of FIG. 3B will be described focusing on a difference than the switch circuit 301 of FIG. 3A.

According to various embodiments, the third switch 360 may connect the third port 362 with the fourth switch 370. For example, a terminal of the third switch 360 may be connected to the third port 362, and the other terminal of the third switch 360 may be connected to the fourth switch 370. Depending on a switch-on/off state of the switch circuit 302, the third switch 360 may be short-circuited or opened. For example, a state where the third switch 360 is short-circuited may be a state where the third switch 360 is turned on, and a state where the third switch 360 is opened may be a state where the third switch 360 is turned off.

According to various embodiments, the fourth switch 370 may connect the third switch 360 with the fourth port 372. For example, a terminal of the fourth switch 370 may be connected to the third switch 360, and the other terminal of the fourth switch 370 may be connected to the fourth port 372. Depending on a switch-on/off state of the switch circuit 302, the fourth switch 370 may be short-circuited or opened. For example, a state where the fourth switch 370 is short-circuited may be a state where the fourth switch 370 is turned on, and a state where the fourth switch 370 is opened may be a state where the fourth switch 370 is turned off.

According to various embodiments, the third switch 360 and the fourth switch 370 may be serially connected with each other.

According to various embodiments, the third switch 360 and the fourth switch 370 may include MOS transistors. For example, the third switch 360 and the fourth switch 370 may include NMOS transistors.

According to various embodiments, the first shunt switch 330 may be connected to a node 315 between the first switch 310 and the second switch 320. For example, the first shunt switch 330 may be connected in parallel to the node 315 between the first switch 310 and the second switch 320. For example, the first shunt switch 330 may be implemented as a parallel switch. For example, a terminal of the first shunt switch 330 may be connected to the node 315, and the other terminal of the first shunt switch 330 may be connected to the second shunt switch 380. For example, the first shunt switch 330 may be connected serially to the second shunt switch 380. The other terminal of the first shunt switch 330 may be connected to the ground. The ground may be implemented as the virtual ground. For example, when the ground is implemented as the virtual ground, the ground may be excluded (or omitted) from the switch circuit 302.

Depending on a switch-on/off state of the switch circuit 302, the first shunt switch 330 may be short-circuited or opened. For example, a state where the first shunt switch 330 is short-circuited may be a state where the first shunt switch 330 is turned on, and a state where the first shunt switch 330 is opened may be a state where the first shunt switch 330 is turned off.

According to various embodiments, the second shunt switch 380 may be connected to a node 365 between the third switch 360 and the fourth switch 370. For example, the second shunt switch 380 may be connected in parallel to the node 365 between the third switch 360 and the fourth switch 370. That is, the second shunt switch 380 may be implemented as a parallel switch. For example, a terminal of the second shunt switch 380 may be connected to the node 365, and the other terminal of the second shunt switch 380 may be connected to the first shunt switch 330. The other terminal of the second shunt switch 380 may be connected to the ground. The ground may be implemented as the virtual ground. For example, when the ground is implemented as the virtual ground, the ground may be excluded (or omitted) from the switch circuit 302.

Depending on a switch-on/off state of the switch circuit 302, the second shunt switch 380 may be short-circuited or opened. For example, a state where the second shunt switch 380 is short-circuited may be a state where the second shunt switch 380 is turned on, and a state where the second shunt switch 380 is opened may be a state where the second shunt switch 380 is turned off.

According to various embodiments, the second shunt switch 380 may include, for example, and without limitation, a MOS transistor. According to various embodiments, the second shunt switch 380 may include, for example, and without limitation, a PMOS transistor.

According to various embodiments, the first shunt inductor 340 may be connected to the node 315 between the first switch 310 and the second switch 320. For example, a terminal of the first shunt inductor 340 may be connected to the node 315, and the other terminal of the first shunt inductor 340 may be connected to the second shunt inductor 390. The other terminal of the first shunt inductor 340 may be connected to the ground. The ground may be implemented as the virtual ground. For example, when the ground is implemented as the virtual ground, the ground may be excluded (or omitted) from the switch circuit 302. The first shunt inductor 340 may include at least one inductor.

According to various embodiments, the first shunt inductor 340 may offset a parasitic capacitance component of the first shunt switch 330. For example, an inductance value of the first shunt inductor 340 may be adjusted or determined to offset the parasitic capacitance component of the first shunt switch 330.

According to various embodiments, the second shunt inductor 390 may be connected to the node 365 between the third switch 360 and the fourth switch 370. For example, a terminal of the second shunt inductor 390 may be connected to the node 365, and the other terminal of the second shunt inductor 390 may be connected to the first shunt inductor 340. The other terminal of the second shunt inductor 390 may be connected to the ground. The ground may be implemented as the virtual ground. For example, when the ground is implemented as the virtual ground, the ground may be excluded (or omitted) from the switch circuit 302. The second shunt inductor 390 may include at least one inductor.

Although FIG. 3B illustrates the switch circuit 302 including the two shunt inductors 340 and 390, the switch circuit 302 may include one inductor. For example, the switch circuit 302 may include one shunt inductor having an inductance value equaling to a sum of an inductance value of the first shunt inductor 340 and an inductance value of the second shunt inductor 390.

According to various embodiments, the second shunt inductor 390 may offset a parasitic capacitance component of the second shunt switch 380. For example, an inductance value of the second shunt inductor 390 may be adjusted or determined to offset the parasitic capacitance component of the second shunt switch 380.

Figure 3C:
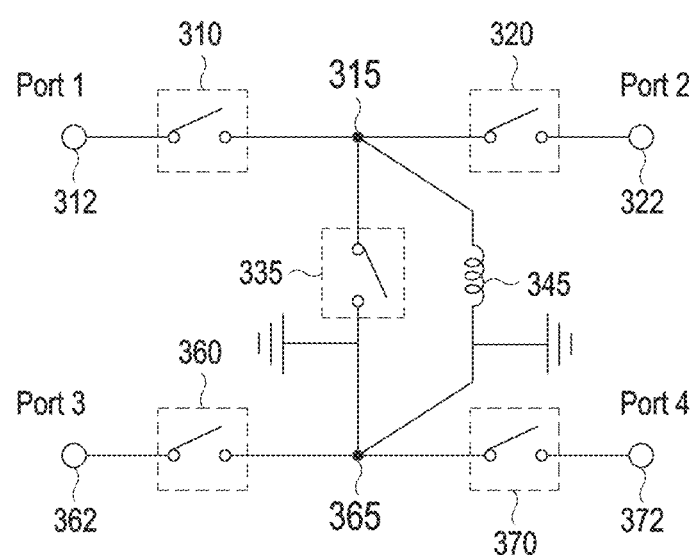
FIG. 3C is a diagram illustrating an example switch circuit of a differential type, according to various embodiments.

FIG. 3C is a diagram illustrating an example switch circuit using a differential scheme, according to various embodiments.

Referring to FIG. 3B, a switch circuit 303 may include the first switch 310, the second switch 320, the first port 312, the second port 322, the third switch 360, the fourth switch 370, the third port 362, the fourth port 372, a shunt switch 335, and a shunt inductor 345.

According to various embodiments, the switch circuit 303 may be a switch circuit having a series-shunt-series structure of a differential type.

According to various embodiments, the switch circuit 303 of FIG. 3C may perform the same or similar function as the switch circuit 302 of FIG. 3B except for the number of shunt switches and the number of inductors. For example, the switch circuit 303 of FIG. 3C may include one shunt switch 335 and one shunt inductor 345 in comparison to the switch circuit 302 of FIG. 3B. Thus, the switch circuit 303 of FIG. 3C will be described focusing on a difference than the switch circuit 302 of FIG. 3B.

According to various embodiments, the shunt switch 335 may be connected to the first node 315 between the first switch 310 and the second switch 320. For example, the shunt switch 335 may be connected to the second node 365 between the third switch 360 and the fourth switch 370.

For example, the shunt switch 335 may be connected in parallel to the first node 315 between the first switch 310 and the second switch 320. For example, the shunt switch 335 may be connected in parallel to the second node 365 between the third switch 360 and the fourth switch 370. For example, the shunt switch 335 may be implemented as a parallel switch. For example, a terminal of the shunt switch 335 may be connected to the first node 315, and the other terminal of the shunt switch 335 may be connected to the second node 365. The shunt switch 335 may be connected to the ground. The ground may be implemented as the virtual ground. For example, when the ground is implemented as the virtual ground, the ground may be excluded (or omitted) from the switch circuit 303.

According to various embodiments, depending on a switch-on/off state of the switch circuit 303, the shunt switch 335 may be short-circuited or opened. For example, a state where the shunt switch 335 is short-circuited may be a state where the shunt switch 335 is turned on, and a state where the shunt switch 335 is opened may be a state where the shunt switch 335 is turned off.

According to various embodiments, the shunt switch 335 may include, for example, and without limitation, a MOS transistor. For example, the shunt switch 335 may include, for example, and without limitation, a PMOS transistor.

According to various embodiments, the shunt inductor 345 may be connected to a node 315 between the first switch 310 and the second switch 320. For example, the shunt switch 345 may be connected to the node 365 between the third switch 360 and the fourth switch 370. For example, a terminal of the shunt switch 345 may be connected to the first node 315, and the other terminal of the shunt switch 345 may be connected to the second node 365. The other terminal of the shunt inductor 345 may be connected to the ground. The ground may be implemented as the virtual ground. For example, when the ground is implemented as the virtual ground, the ground may be excluded (or omitted) from the switch circuit 303. The shunt inductor 345 may have an inductance (or an inductance value) capable of offsetting a parasitic capacitance of the shunt switch 335.

According to various embodiments, the shunt inductor 345 may offset a parasitic capacitance component of the shunt switch 335. For example, an inductance value of the shunt inductor 345 may be adjusted or determined to offset the parasitic capacitance component of the shunt switch 335.

Although a switch circuit including shunt switches of different numbers and shunt inductors of different numbers are shown in FIGS. 3A and 3B, the number of shunt switches and the number of shunt inductors may not be limited thereto.

Figures 4A, 4B:
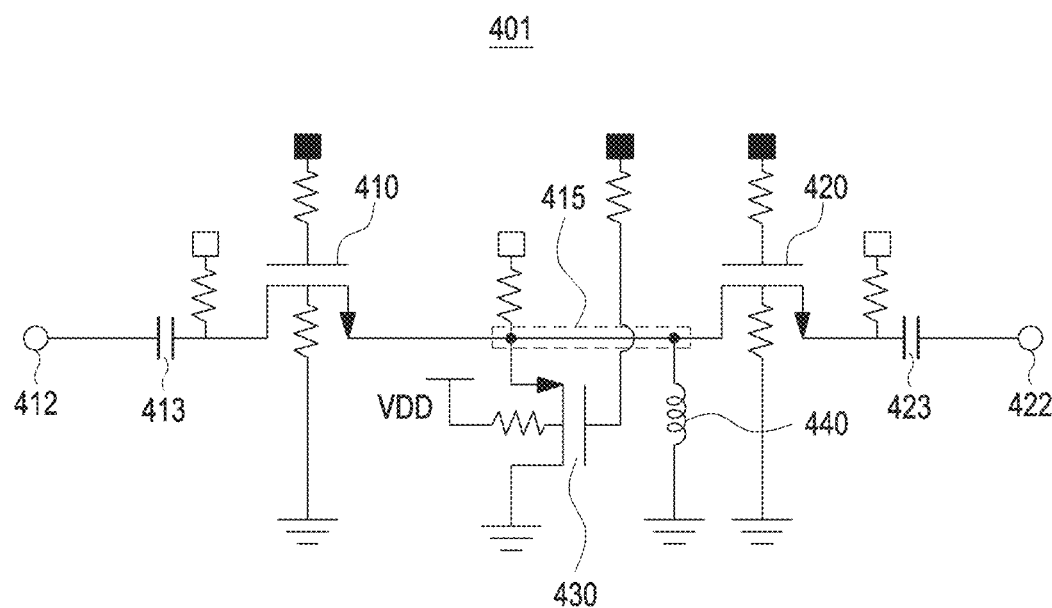
FIG. 4A is a diagram illustrating an example switch circuit including a transistor according to various embodiments.
FIG. 4B is a diagram illustrating an example operation of a switch circuit, according to various embodiments.

FIG. 4A is a diagram illustrating an example switch circuit including a transistor according to various embodiments.

FIG. 4B is a diagram illustrating an example operation of a switch circuit, according to various embodiments.

Referring to FIG. 4A, a switch circuit 401 may include a first switch 410, a second switch 420, a third switch 430, a shunt inductor 440, a first decoupling capacitor 413 for the first transistor 410, and a second decoupling capacitor 423 for the second transistor 420. The switch circuit 401 may further include at least one resistor.

According to various embodiments, the switch circuit 401 may be a circuit that is the same as or similar with the switch circuit 301 of FIG. 3A. For example, the first transistor 410 may correspond to the first switch 310, the second transistor 420 may correspond to the second switch 320, and the third transistor 430 may correspond to the shunt switch 330. The shunt inductor 440 may correspond to the shunt inductor 340. For example, each of the third transistor 430 and the shunt inductor 440 may be connected to the first node 415 between the first transistor 410 and the second transistor 420. For example, the switch circuit 401 may be a switch circuit having a series-shunt-series structure.

According to various embodiments, the first transistor 410 and the second transistor 420 may be implemented, for example, and without limitation, as NMOS transistors, and the third transistor 420 may be implemented, for example, and without limitation, as a PMOS transistor.

According to various embodiments, in the switch-on state of the switch circuit 401, a voltage VDD may be applied to gates of the first transistor 410 and the second transistor 420, a voltage of 0V that is opposite to the gate voltage may be applied to drains and sources of the first transistor 410 and the second transistor 420. A voltage of 0V may be applied to a gate of the third transistor 430, and the voltage VDD that is opposite to the gate voltage may be applied to a drain and a source of the third transistor 430. Thus, the switch circuit 401 may be in a state where electric current may flow from the first port 412 to the second port 422 through the first transistor 410 and the second transistor 420. The switch circuit 401 may be in a state where electric current may not flow through the third transistor 430.

According to various embodiments, in the switch-off state of the switch circuit 401, a voltage of 0V may be applied to gates of the first transistor 410 and the second transistor 420, and the voltage VDD that is opposite to the gate voltage may be applied to drains and sources of the first transistor 410 and the second transistor 420. The voltage VDD may be applied to the gate of the third transistor 430, and a voltage of 0V that is opposite to the gate voltage may be applied to the drain and source of the third transistor 430. Thus, the switch circuit 401 may be in a state where electric current may not flow from the first port 412 to the second port 422 through the first transistor 410 and the second transistor 420. The switch circuit 401 may be in a state where electric current may flow through the third transistor 430.

According to various embodiments, values (e.g., capacitance values) of the first decoupling capacitor 413 and the second decoupling capacitor 423 included in the switch circuit 401 of FIG. 4A and a value (e.g., an inductance value) of the shunt inductor 440 included in the switch circuit 401 of FIG. 4A may be determined or changed. For example, the changed values of the first decoupling capacitor 413 and the second decoupling capacitor 423 and the changed value of the shunt inductor 440 may be used for impedance matching (e.g., matching to an optimum value). In addition, the changed values of the first decoupling capacitor 413 and the second decoupling capacitor 423 and the changed value of the shunt inductor 440 may be used for RF signal matching.

Figure 5:
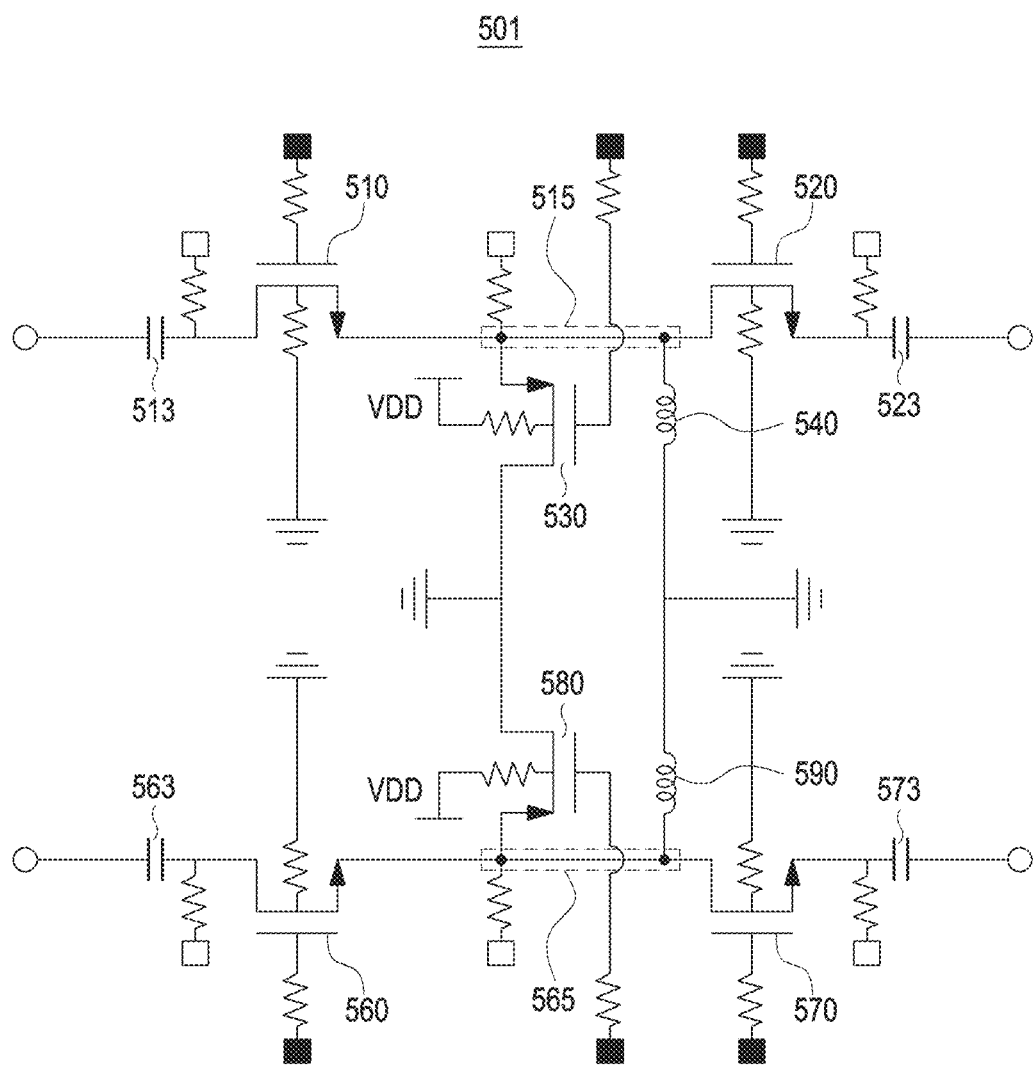
FIG. 5 is a diagram illustrating an example switch circuit of a differential type, according to various embodiments.

FIG. 5 is a diagram illustrating an example switch circuit using a differential scheme, according to various embodiments.

Referring to FIG. 5, a switch circuit 501 may include a first transistor 510, a second transistor 520, a third transistor 530, a first shunt inductor 540, a first decoupling capacitor 513 for the first transistor 510, a second decoupling capacitor 523 for the second transistor 520, a fourth transistor 560, a fifth transistor 570, a sixth transistor 580, a second shunt inductor 590, a third decoupling capacitor 563 for the fourth transistor 560, and a fourth decoupling capacitor 573 for the fifth transistor 570. The switch circuit 501 may further include at least one resistor.

According to various embodiments, the switch circuit 501 may be a circuit that is the same as or similar with the switch circuit 302 of FIG. 3B. For example, the first transistor 510 may correspond to the first switch 310, the second transistor 520 may correspond to the second switch 320, the third transistor 530 may correspond to the first shunt switch 330, and the first shunt inductor 540 may correspond to the shunt inductor 340. In addition, the fourth transistor 560 may correspond to the third switch 360, the fifth transistor 570 may correspond to the fourth switch 370, the sixth transistor 580 may correspond to the second shunt switch 380, and the second shunt inductor 590 may correspond to the shunt inductor 390.

According to various embodiments, the shunt switch 501 may be a circuit of a differential type. For example, the switch circuit 501 may include two input ports and two output ports. That is, the switch circuit 501 of FIG. 5 may perform the same function as the switch circuit 401 of FIG. 4A except for the number of input ports and the number of output ports. Thus, the switch circuit 501 of FIG. 5 will be described focusing on a difference than the switch circuit 401 of FIG. 4A.

According to various embodiments, the first transistor 510, the second transistor 520, the fourth transistor 560, and the fifth transistor 570 may be implemented, for example, and without limitation, as NMOS transistors, and the third transistor 530 and the sixth transistor 580 may be implemented, for example, and without limitation, as PMOS transistors.

According to various embodiments, a terminal of the third transistor 530 may be connected to the first node 515 between the first transistor 510 and the second transistor 520, and the other terminal of the third transistor 530 may be connected to the sixth transistor 580. In addition, a terminal of the sixth transistor 580 may be connected to the second node 565 between the fourth transistor 560 and the fifth transistor 570, and the other terminal of the sixth transistor 580 may be connected to the third transistor 530. For example, the third transistor 530 may be connected serially to the sixth transistor 580. The other terminal of the third transistor 530 and the other terminal of the sixth transistor 580 may be connected to the ground. The ground may be implemented as the virtual ground. For example, when the ground is implemented as the virtual ground, the ground may be excluded (or omitted) from the switch circuit 501.

According to various embodiments, in the switch-on state of the switch circuit 501, the voltage VDD may be applied to gates of the first transistor 510, the second transistor 520, the fourth transistor 560, and the fifth transistor 570, and a voltage of 0V that is opposite to the gate voltage may be applied to drains and sources of the first transistor 510, the second transistor 520, the fourth transistor 560, and the fifth transistor 570. A voltage of 0V may be applied to gates of the third transistor 530 and the sixth transistor 580, and the voltage VDD that is opposite to the gate voltage may be applied to drains and sources of the third transistor 530 and the sixth transistor 580. Thus, the switch circuit 501 may be in a state where electric current may flow through the first transistor 510, the second transistor 520, the fourth transistor 560, and the fifth transistor 570. The switch circuit 501 may be in a state where electric current may not flow through the third transistor 530 and the sixth transistor 580.

According to various embodiments, in the switch-off state of the switch circuit 501, a voltage of 0V may be applied to gates of the first transistor 510, the second transistor 520, the fourth transistor 560, and the fifth transistor 570, and the voltage VDD that is opposite to the gate voltage may be applied to the drains and sources of the first transistor 510, the second transistor 520, the fourth transistor 560, and the fifth transistor 570. The voltage VDD may be applied to the gates of the third transistor 530 and the sixth transistor 580, and a voltage of 0V that is opposite to the gate voltage may be applied to the drains and sources of the third transistor 530 and the sixth transistor 580. Thus, the switch circuit 501 may be in a state where electric current may not flow through the first transistor 510, the second transistor 520, the fourth transistor 560, and the fifth transistor 570. The switch circuit 501 may be in a state where electric current may flow through the third transistor 530 and the sixth transistor 580.

According to various embodiments, the first shunt inductor 540 may be connected to the first node 515. The second shunt inductor 590 may correspond to the second node 565. For example, a terminal of the first shunt inductor 540 may be connected to the first node 515, and the other terminal of the first shunt inductor 540 may be connected to the second shunt inductor 590. A terminal of the second shunt inductor 590 may be connected to the second node 565, and the other terminal of the second shunt inductor 590 may be connected to the first shunt inductor 540. The other terminal of the first transistor 540 and the other terminal of the second shunt inductor 590 may be connected to the ground. The ground may be implemented as the virtual ground. For example, when the ground is implemented as the virtual ground, the ground may be excluded (or omitted) from the switch circuit 501. For example, the first shunt inductor 540 may have an inductance (or an inductance value) capable of offsetting the parasitic capacitance of the third transistor 530, and the second shunt inductor 590 may have an inductance (or an inductance value) capable of offsetting a parasitic capacitance of the sixth transistor 580.

According to various embodiments, values (e.g., capacitance values) of the first decoupling capacitor 513, the second decoupling capacitor 523, the third decoupling capacitor 563, and the fourth decoupling capacitor 573 and values (e.g., inductance values) of the first shunt inductor 540 and the second shunt inductor 590 may be determined or changed. For example, the changed values of the first decoupling capacitor 513, the second decoupling capacitor 523, the third decoupling capacitor 563, and the fourth decoupling capacitor 573 and the changed values of the first shunt inductor 540 and the second shunt inductor 590 may be used for impedance matching (e.g., matching to an optimum value). In addition, the changed values of the first decoupling capacitor 513, the second decoupling capacitor 523, the third decoupling capacitor 563, and the fourth decoupling capacitor 573 and the changed values of the first shunt inductor 540 and the second shunt inductor 590 may be used for RF signal matching.

Although FIG. 5 illustrates the switch circuit 501 including the two shunt inductors 540 and 590, the switch circuit 501 may include one inductor. For example, the switch circuit 501 may include one shunt inductor having an inductance value equaling to a sum of an inductance value of the first shunt inductor 540 and an inductance value of the second shunt inductor 590.

Figure 6:
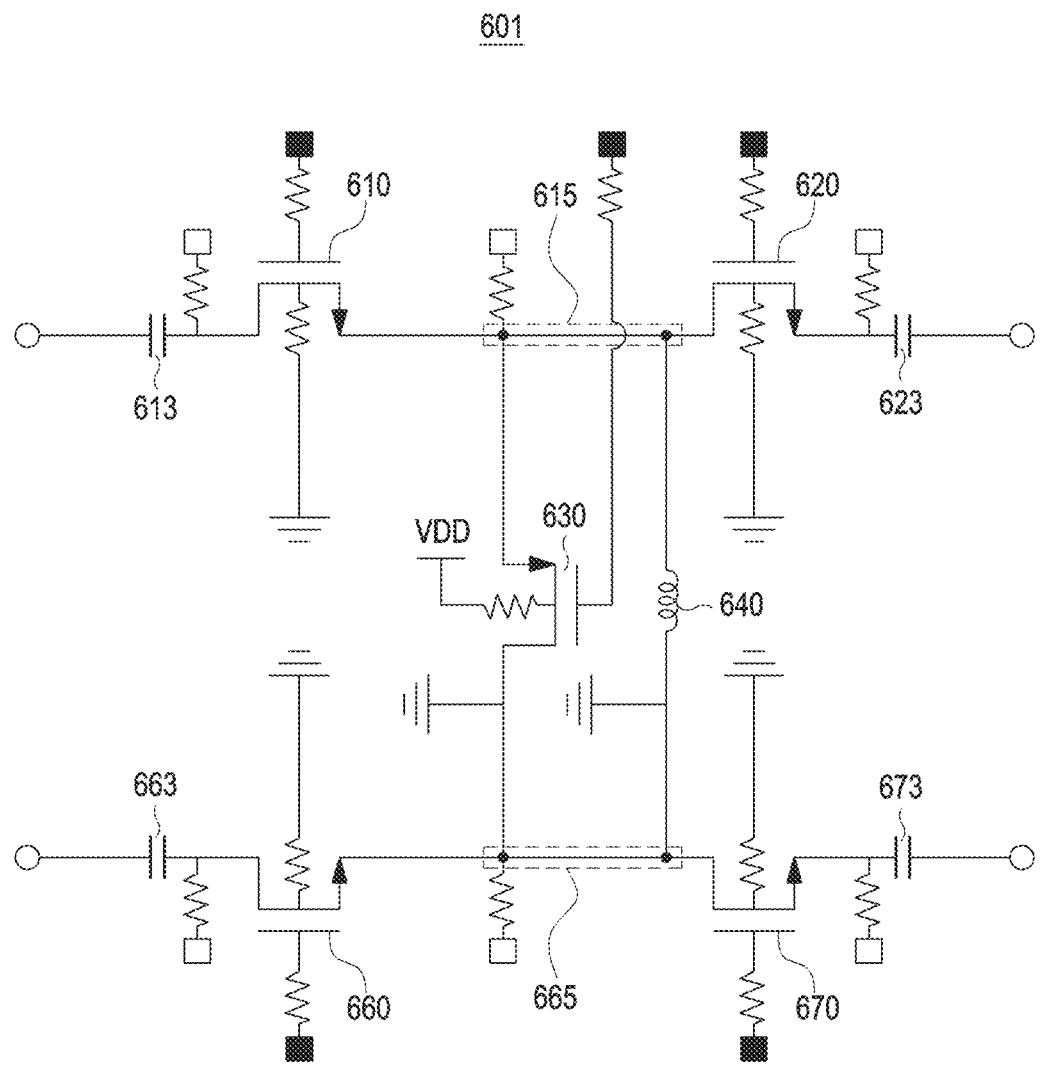
FIG. 6 is a diagram illustrating an example switch circuit of a differential type, according to various embodiments.

FIG. 6 is a diagram illustrating an example switch circuit of a differential type, according to various embodiments.

Referring to FIG. 6, a switch circuit 601 may include a first transistor 610, a second transistor 620, a third transistor 630, a shunt inductor 640, a first decoupling capacitor 613 for the first transistor 610, a second decoupling capacitor 623 for the second transistor 620, a fourth transistor 660, a fifth transistor 670, a third decoupling capacitor 663 for the fourth transistor 660, and a fourth decoupling capacitor 673 for the fifth transistor 670. The switch circuit 601 may further include at least one resistor.

According to various embodiments, the switch circuit 601 may be a circuit that is the same as or similar with the switch circuit 303 of FIG. 3C. For example, the first transistor 610 may correspond to the first switch 310, the second transistor 620 may correspond to the second switch 320, the third transistor 630 may correspond to the first shunt switch 335, and the shunt inductor 640 may correspond to the shunt inductor 345. The fourth transistor 660 may correspond to the third switch 360, and the fifth transistor 670 may correspond to the fourth switch 370.

According to various embodiments, the switch circuit 601 of FIG. 6 may perform the same function as the switch circuit 501 of FIG. 5 except for the number of shunt-connected transistors and the number of inductors. That is, the switch circuit 601 of FIG. 6 may include one shunt-connected transistor 630 and one shunt inductor 640 in comparison to the switch circuit 501 of FIG. 5. Thus, the switch circuit 601 of FIG. 6 will be described focusing on a difference than the switch circuit 501 of FIG. 5.

According to various embodiments, the third transistor 630 may be connected to the first node 615 between the first transistor 610 and the second transistor 620. In addition, the third transistor 630 may be connected to the second node 665 between the first transistor 610 and the second transistor 620. For example, a terminal of the third transistor 630 may be connected to the first node 615, and the other terminal of the third transistor 630 may be connected to the second node 665. The other terminal of the third transistor 630 may be connected to the ground. The ground may be implemented as the virtual ground. For example, when the ground is implemented as the virtual ground, the ground may be excluded (or omitted) from the switch circuit 601.

According to various embodiments, the shunt inductor 640 may be connected to the first node 615. The shunt inductor 640 may be connected to the second node 565. For example, a terminal of the shunt switch 640 may be connected to the first node 615, and the other terminal of the shunt switch 640 may be connected to the second node 665. The other terminal of the shunt inductor 640 may be connected to the ground. The ground may be implemented as the virtual ground. For example, when the ground is implemented as the virtual ground, the ground may be excluded (or omitted) from the switch circuit 601. The shunt inductor 640 may have an inductance (or an inductance value) capable of offsetting a parasitic capacitance of the third transistor 630.

According to various embodiments, in the switch-on state of the switch circuit 601, a voltage of 0V may be applied to a gate of the third transistor 630, and the voltage VDD that is opposite to the gate voltage may be applied to a drain and a source of the third transistor 630. Thus, the switch circuit 601 may be in a state where electric current may not flow through the third transistor 630.

According to various embodiments, in the switch-off state of the switch circuit 601, the voltage VDD may be applied to the gate of the third transistor 630, and a voltage of 0V that is opposite to the gate voltage may be applied to the drain and source of the third transistor 630. Thus, the switch circuit 601 may be in a state where electric current may flow through the third transistor 630.

Figure 7A:
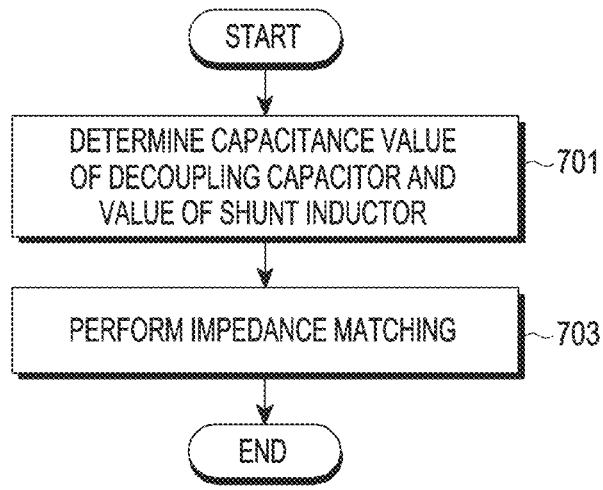
FIG. 7A is a flowchart illustrating an example operation of performing impedance matching using a switch circuit according to various embodiments.
Figure 7B:
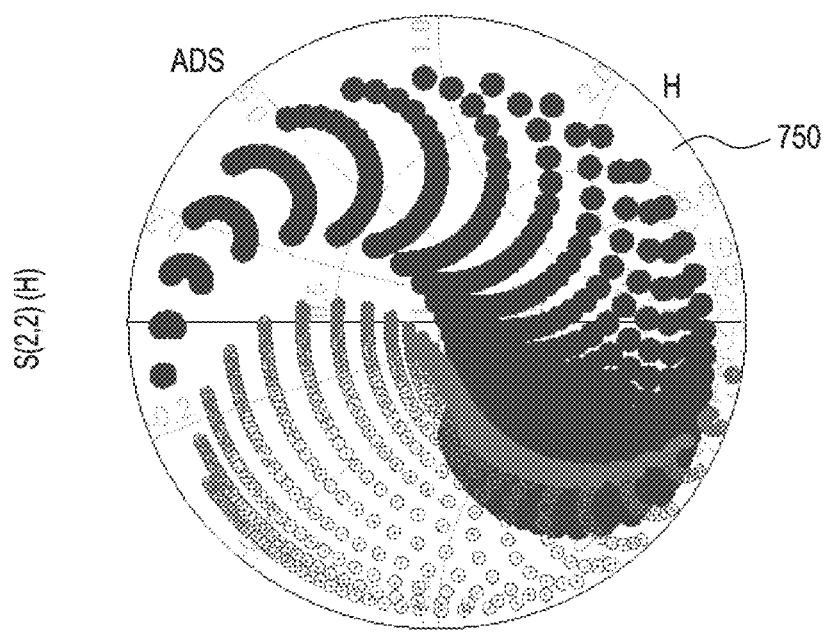
FIG. 7B is a diagram illustrating an example operation of performing impedance matching using a switch circuit, according to various embodiments.

FIG. 7A is a flowchart illustrating an example operation of performing impedance matching using a switch circuit according to various embodiments, and FIG. 7B is a diagram illustrating an example operation of performing impedance matching using a switch circuit, according to various embodiments.

Referring to FIG. 7A, in operation 701, a switch circuit (e.g., 401, 501, and 601) may determine a capacitance value of a decoupling capacitor and an inductance value of a shunt inductor.

According to various embodiments, values (e.g., capacitance values) of the first decoupling capacitor 413 and the second decoupling capacitor 423 included in the switch circuit 401 of FIG. 4A and a value (e.g., an inductance value) of the shunt inductor 440 included in the switch circuit 401 of FIG. 4A may be determined.

According to various embodiments, values (e.g., capacitance values) of the first decoupling capacitor 513, the second decoupling capacitor 523, the third decoupling capacitor 563, and the fourth decoupling capacitor 573 of the switch circuit 501 of FIG. 5 and values (e.g., inductance values) of the first shunt inductor 540 and the second shunt inductor 590 of the switch circuit 501 of FIG. 5 may be determined.

According to various embodiments, values (e.g., capacitance values) of the first decoupling capacitor 513, the second decoupling capacitor 523, the third decoupling capacitor 563, and the fourth decoupling capacitor 573 of the switch circuit 601 of FIG. 6 and a value (e.g., inductance values) of the shunt inductor 640 of the switch circuit 601 of FIG. 6 may be determined.

In operation 703, impedance matching may be performed based on the determined capacitance value of the decoupling capacitor and the determined inductance value of the shunt inductor. In addition, RF signal matching may be performed based on the determined capacitance value of the decoupling capacitor and the determined inductance value of the shunt inductor.

FIG. 7B illustrates plots 750 indicating an impedance value with respect to a capacitance value of a decoupling capacitor and an inductance value of a shunt inductor. As shown in FIG. 7B, when the capacitance value of the decoupling capacitor and the inductance value of the shunt inductor are changed, impedance may be changed. Thus, RF signal matching may be performed by properly changing the capacitance value of the decoupling capacitor and the inductance value of the shunt inductor without adding a separate element.

According to various embodiments, the determined values of the first decoupling capacitor 413 and the second decoupling capacitor 423 of the switch circuit 401 of FIG. 4A and the determined value of the shunt inductor 440 of the switch circuit 401 of FIG. 4A may be used for impedance matching (e.g., matching to an optimum value). In addition, the determined values of the first decoupling capacitor 413 and the second decoupling capacitor 423 and the determined value of the shunt inductor 440 may be used for RF signal matching.

According to various embodiments, the determined values of the first decoupling capacitor 513, the second decoupling capacitor 523, the third decoupling capacitor 563, and the fourth decoupling capacitor 573 of the switch circuit 501 of FIG. 5 and the determined values of the first shunt inductor 540 and the second shunt inductor 590 of the switch circuit 501 of FIG. 5 may be used for impedance matching (e.g., matching to an optimum value). In addition, the determined values of the first decoupling capacitor 513, the second decoupling capacitor 523, the third decoupling capacitor 563, and the fourth decoupling capacitor 573 and the determined values of the first shunt inductor 540 and the second shunt inductor 590 may be used for RF signal matching.

According to various embodiments, the determined values of the first decoupling capacitor 613, the second decoupling capacitor 623, the third decoupling capacitor 663, and the fourth decoupling capacitor 673 of the switch circuit 601 of FIG. 6 and the determined value of the shunt inductor 640 of the switch circuit 601 of FIG. 6 may be used for impedance matching (e.g., matching to an optimum value). In addition, the determined values of the first decoupling capacitor 613, the second decoupling capacitor 623, the third decoupling capacitor 663, and the fourth decoupling capacitor 673 and the determined value of the shunt inductor 640 may be used for RF signal matching.

Figure 8:
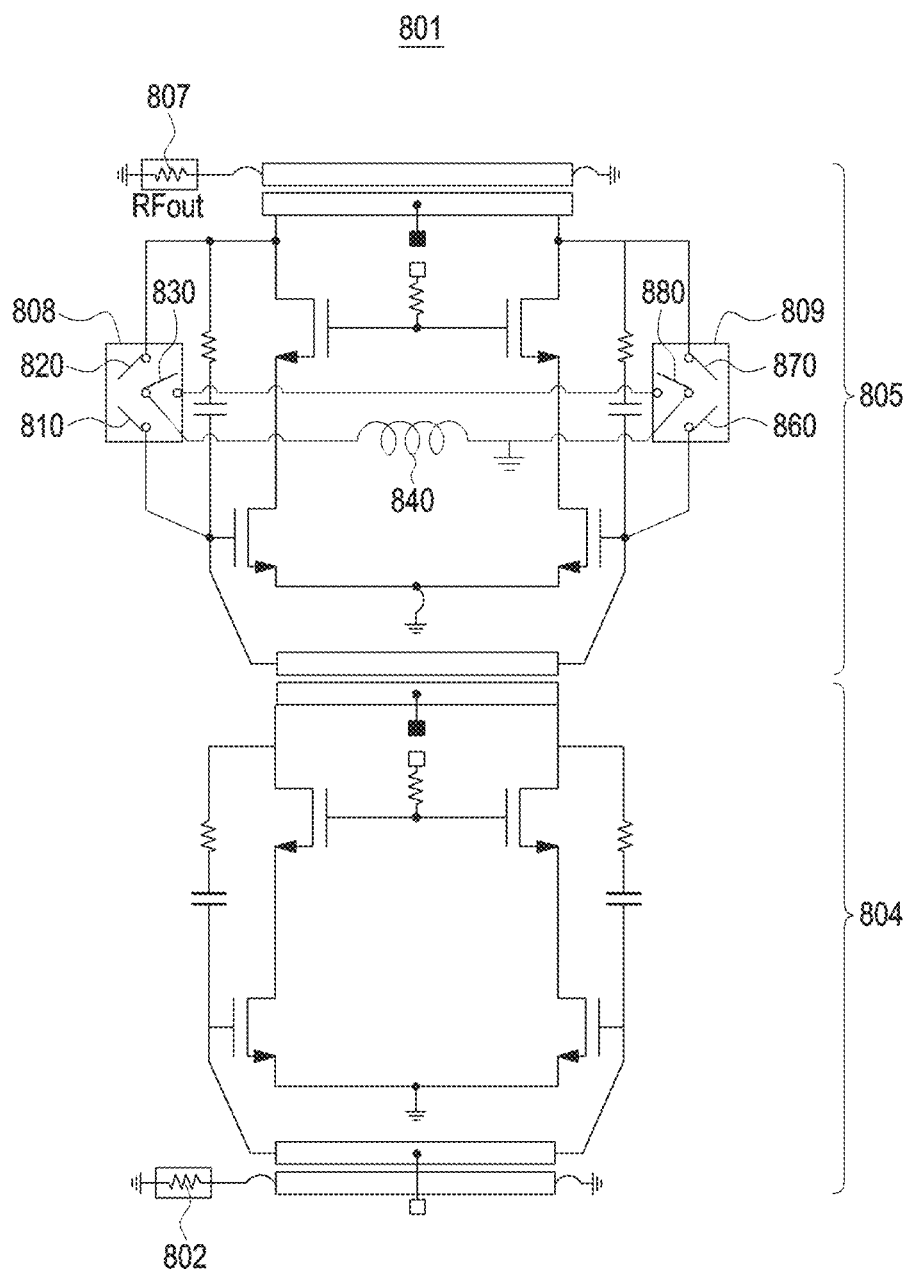
FIG. 8 is a diagram illustrating an example power amplifier including a switch circuit according to various embodiments.

FIG. 8 is a diagram illustrating an example power amplifier including a switch circuit according to various embodiments.

Referring to FIG. 8, a power amplifier 801 may include a dual mode power amplifier. For example, the dual mode power amplifier may refer, for example, to a power amplifier that supports a high power mode and a low power mode. For example, the power amplifier 801 may be of a differential type.

According to various embodiments, the power amplifier 801 may include a first amplifier 804 of a drive stage and a second amplifier 805 of a power stage.

According to various embodiments, the first amplifier 804 may receive a signal from an input terminal 802 and amplify the received signal to output the same to the second amplifier 805. The first amplifier 804 may include a drive amplifier.

According to various embodiments, the second amplifier 805 may include switch circuits 808 and 809. For example, the switch circuits 808 and 809 may be positioned in a feedback path of the second amplifier 805. For example, the switch circuits 808 and 809 of FIG. 8 may be switch circuits of a differential type and may be implemented as the switch circuit 302 of FIG. 3B or the switch circuit 303 of FIG. 3C. The switch circuits 808 and 809 of FIG. 8 may be implemented as the switch circuit 501 of FIG. 5 or the switch circuit 601 of FIG. 6.

According to various embodiments, the switch circuits 808 and 809 may include the first switch circuit 808 and the second switch circuit 809 that are divided separately for an input port. For example, the first switch circuit 808 may include a first switch 810, a second switch 820, and a first shunt switch 830 that are serially connected to one another. The second switch circuit 809 may include a third switch 860, a fourth switch 870, and a second shunt switch 880 that are serially connected to one another.

According to various embodiments, the power amplifier 801 may control the switch circuits 808 and 809 to amplify a signal through the first amplifier 804 and the second amplifier 805 in the high power mode. That is, the power amplifier 801 may amplify a signal in two stages in the high power mode. The power amplifier 801 may output the signal amplified using the first amplifier 804 and the second amplifier 805 to a load through an output terminal 807, in the high power mode.

According to various embodiments, the power amplifier 801 may control the switch circuits 808 and 809 to amplify a signal through the first amplifier 804 in the low power mode. For example, the power amplifier 801 may amplify a signal in one stage in the low power mode. For example, the second amplifier 805 of the power amplifier 801 may not consume power (e.g., direct current (DC) power) in the low power mode. The power amplifier 801 may output the signal amplified using the first amplifier 804 to the load through the output terminal 807, in the low power mode.

According to various embodiments, the second amplifier 805 may use 3.3V as the voltage VDD, taking account of the breakdown issue and output power performance. In the second amplifier 805, in a casecode, a thick gate oxide element having a high breakdown voltage may be used for a common gate portion.

According to various embodiments, the first amplifier 804 plays an important role in the low power mode, and thus may use 2.4V as the voltage VDD for high efficiency. The first amplifier 804 may use two thin gate oxide elements as cascodes.

According to various embodiments, a plurality of power amplifiers 801 may be applied to a beamforming array system to which beamforming technology is applied.

Figure 9A:
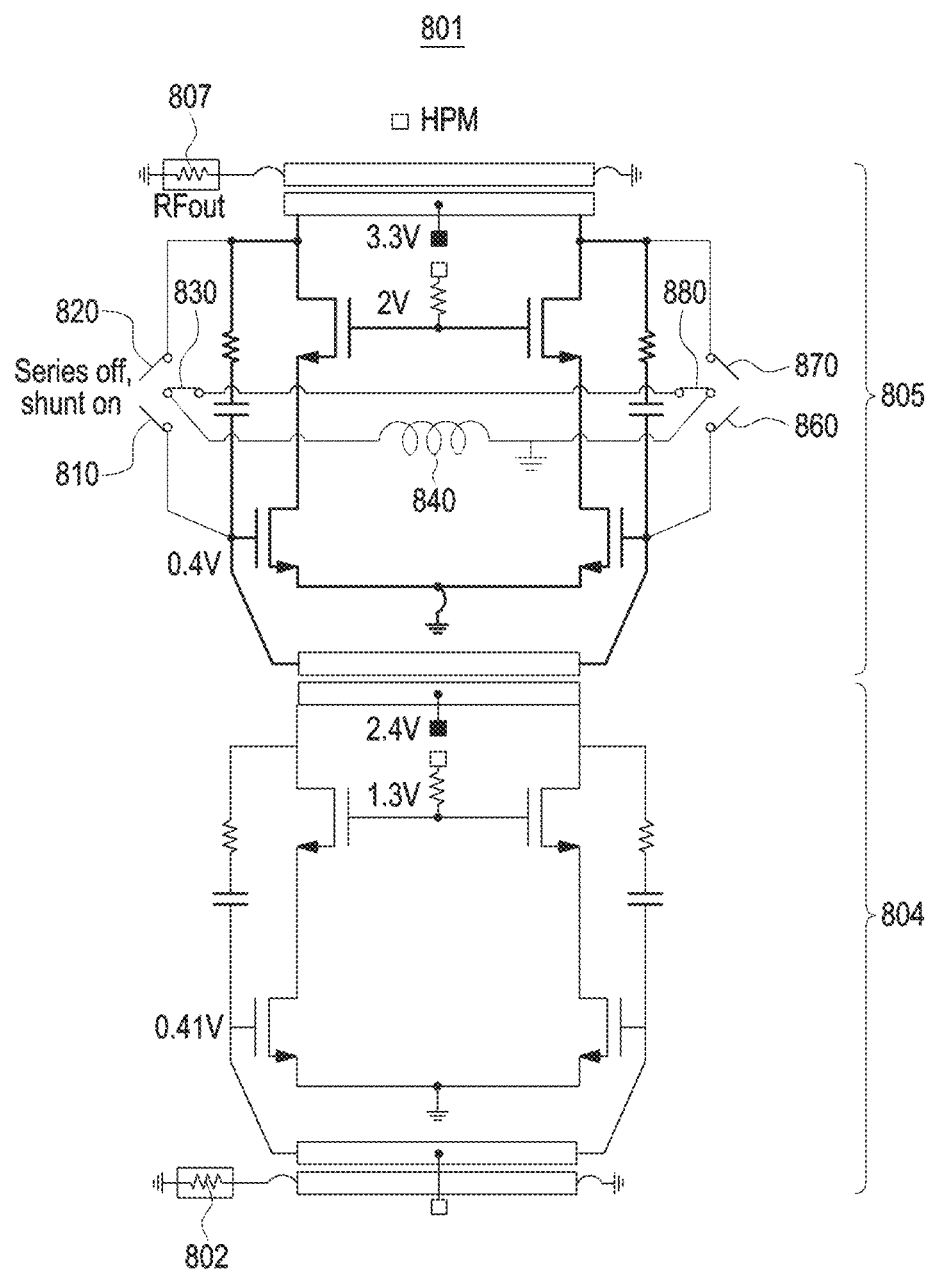
FIG. 9A is a diagram illustrating an example operation of a power amplifier, according to various embodiments.
Figure 9B:
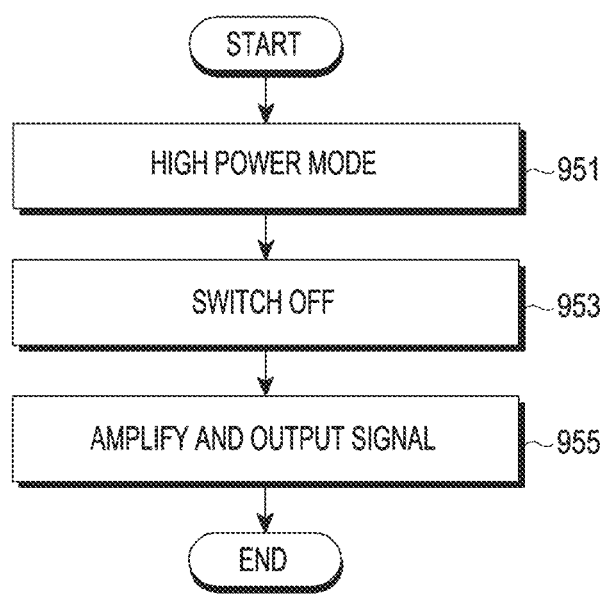
FIG. 9B is a flowchart illustrating an example operation of a power amplifier, according to various embodiments.

FIG. 9A is a diagram illustrating an example operation of a power amplifier, according to various embodiments, and FIG. 9B is a flowchart illustrating an example operation of a power amplifier, according to various embodiments.

Referring to FIGS. 9A and 9B, the power amplifier 801 may be driven in a high power mode (HPM) in operation 951.

According to various embodiments, in the high power mode, the power amplifier 801 may switch off the switch circuits 808 and 809, in operation 953. For example, the first switch 810 and the second switch 820 that are serially connected to each other may be turned off (or switched off) and the first shunt switch 830 may be turned on (or switched on). In addition, the third switch 860 and the fourth switch 870 that are serially connected to each other may be turned off (or switched off) and the second shunt switch 880 may be turned on (or switched on).

According to various embodiments, in the high power mode, the power amplifier 801 may amplify a signal received through the input terminal 802 using the first amplifier 804 and the second amplifier 805 (in this case, the first amplifier 804 and the second amplifier 805 consume DC power for signal amplification) and output the amplified signal to the load through the output terminal 807, in operation 955. Even when leakage power to the switch circuits 808 and 809 is generated, the leakage power may little affect the performance of the power amplifier 801 because the switch circuits 808 and 809 of the power amplifier 801 are positioned in the feedback path of the second amplifier 805.

Figure 10A:
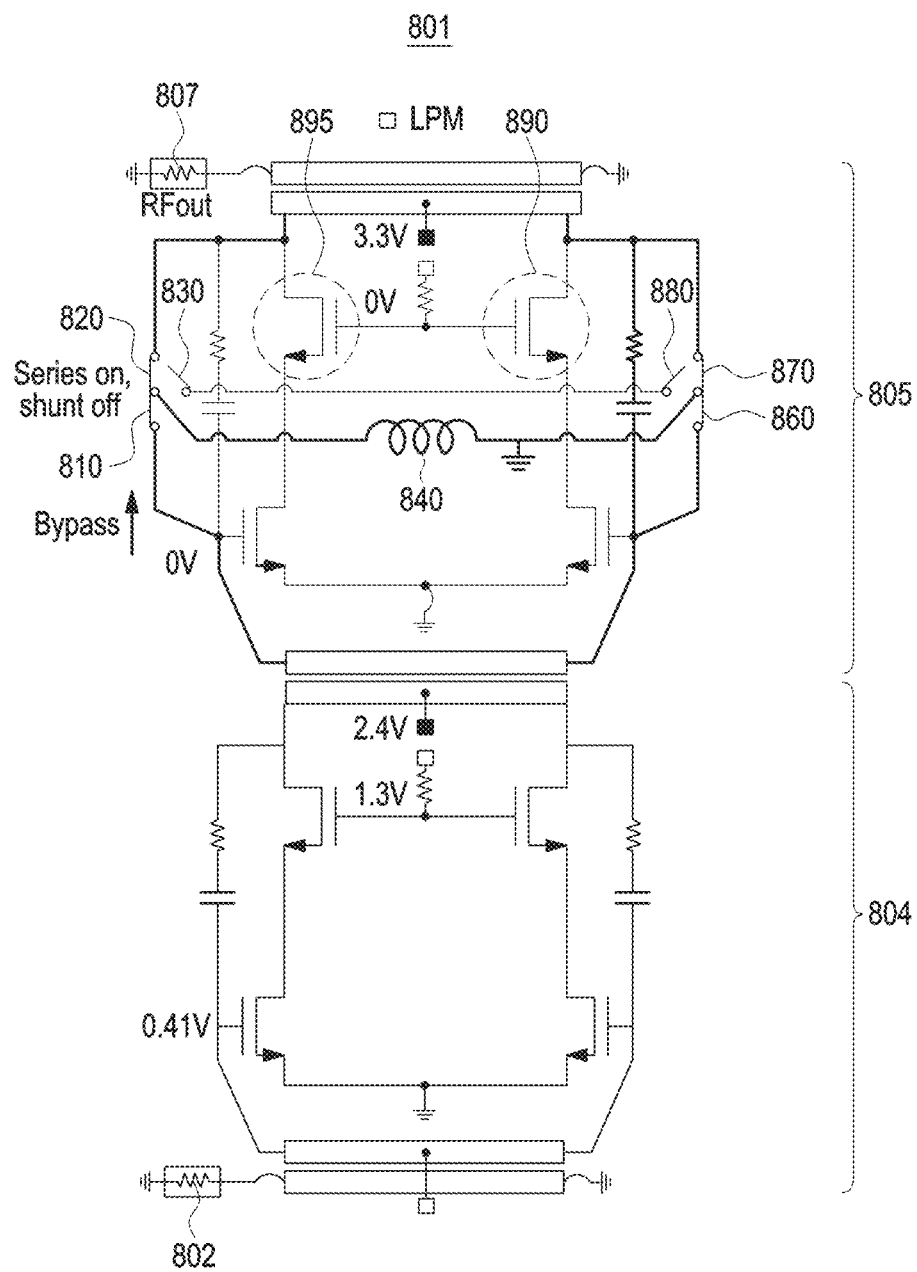
FIG. 10A is a diagram illustrating an example operation of a power amplifier, according to various embodiments.
Figure 10B:
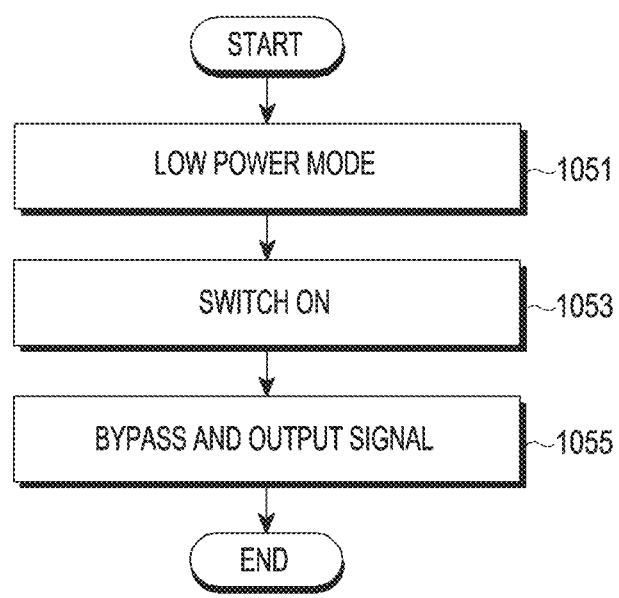
FIG. 10B, is a flowchart illustrating an example operation of a power amplifier, according to various embodiments.

FIG. 10A is a diagram illustrating an example operation of a power amplifier, according to various embodiments, and FIG. 10B is a flowchart illustrating an example operation of a power amplifier, according to various embodiments.

Referring to FIGS. 10A and 10B, the power amplifier 801 may be driven in a low power mode (LPM) in operation 1051.

According to various embodiments, in the low power mode, the power amplifier 801 may switch on the switch circuits 808 and 809, in operation 1053. For example, the first switch 810 and the second switch 820 that are serially connected to each other may be turned on (or switched on), and the first shunt switch 830 may be turned off (or switched off). The third switch 860 and the fourth switch 870 that are serially connected to each other may be turned on (or switched on), and the second shunt switch 880 may be turned off (or switched off).

According to various embodiments, in the low power mode, the power amplifier 801 may amplify the signal received through the input terminal 802 using the first amplifier 804 and bypass the amplified signal through the switch circuits 808 and 809 to output the signal. For example, the power amplifier 801 may output the signal amplified using the first amplifier 804 to the load through the output terminal 807, in operation 1055.

According to various embodiments, the power amplifier 801 may minimize and/or reduce power leaking toward a common drain of the transistors 890 and 895 using the common gate portion as a switch, in the low power mode. For example, the power amplifier 801 may maintain the voltage VDD (e.g., a drain voltage) of the second amplifier 805 at a high voltage (e.g., 3.3V), thus minimizing and/or reducing leakage power. Moreover, the power amplifier 801 may not require a separate VDD switch for controlling the voltage VDD.

According to various embodiments, the power amplifier 801 may perform impedance matching (or matching to an optimum value) by adjusting or changing (or determining) a capacitance value of a decoupling capacitor included in the switch circuits 808 and 809 and an inductance value of the shunt inductor 840 included in the switch circuits 808 and 809, in the low power mode, such that the first amplifier 804 may have maximum efficiency.

Figure 11:
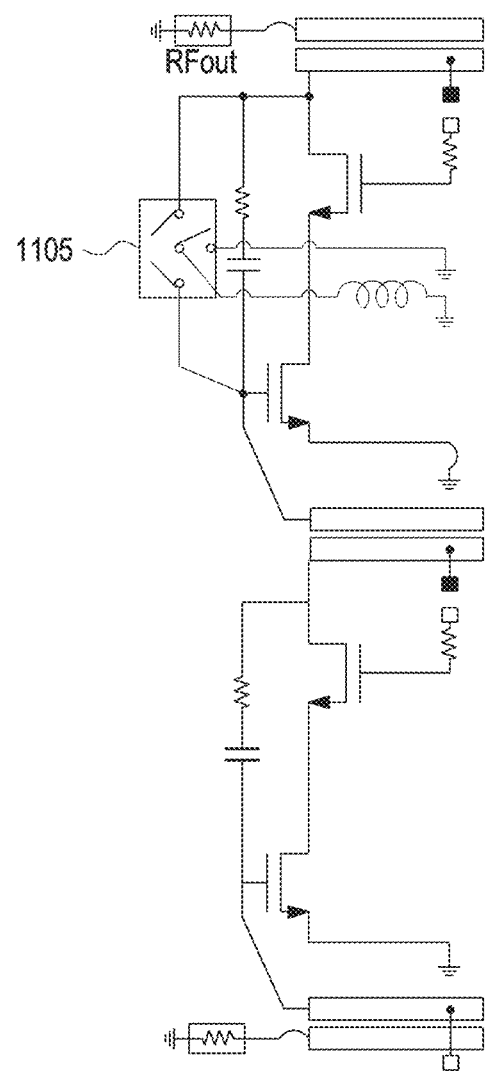
FIG. 11 is a diagram illustrating an example power amplifier including a switch circuit according to various embodiments.

FIG. 11 is a diagram illustrating an example power amplifier including a switch circuit according to various embodiments.

Referring to FIG. 11, a power amplifier 1101 may include a dual mode power amplifier. For example, the power amplifier 1101 may be of a differential type.

The power amplifier 1101 may include a switch circuit 1105 in an amplifier of a power stage. For example, the switch circuit 1105 may be positioned in a feedback path of the amplifier of the power stage. For example, the switch circuit 1101 of FIG. 11 may be implemented as the switch circuit 301 of FIG. 3A or the switch circuit 401 of FIG. 4A.

According to various embodiments, the power amplifier 1101 may be implemented as being the same as or similar to the power amplifier 801 of FIG. 8 except for using a single port. Thus, the operation of the power amplifier 1101 may also be implemented as being the same as or similar to the operation of the power amplifier 801 of FIGS. 9 and 10 except for using a single port.

Figure 12:
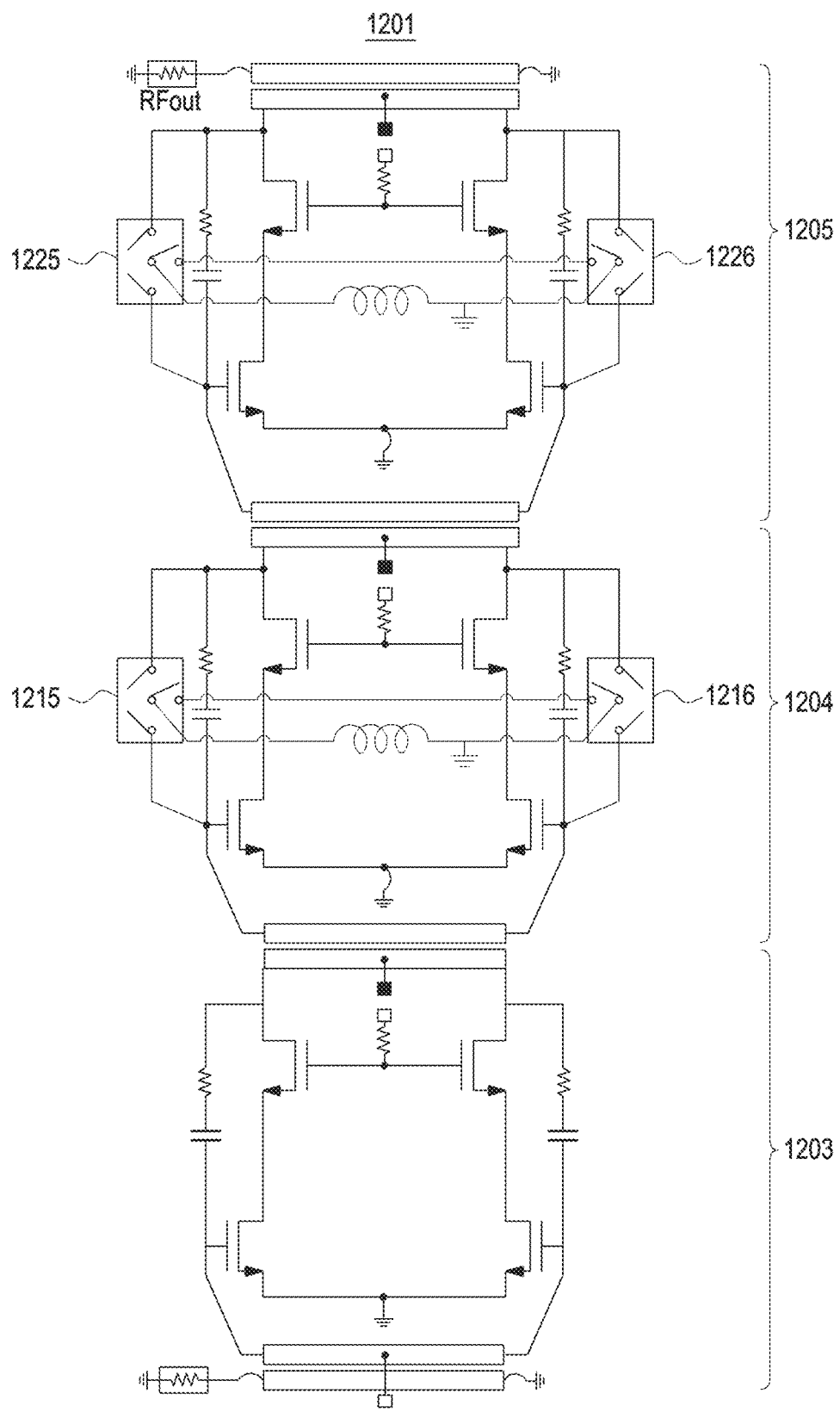
FIG. 12 is a diagram illustrating an example power amplifier including a switch circuit according to various embodiments.

FIG. 12 is a diagram illustrating an example power amplifier including a switch circuit according to various embodiments.

Referring to FIG. 12, a power amplifier 1201 may include a dual mode power amplifier. For example, the power amplifier 1201 may be of a differential type.

According to various embodiments, the power amplifier 1201 may include a first amplifier 1203 of the drive stage, a second amplifier 1204 of the power stage, and a third amplifier 1205 of the power stage. For example, the power amplifier 1201 may further include the third amplifier 1205 corresponding to the power stage when compared to the power amplifier 801 of FIG. 8.

According to various embodiments, the second amplifier 1204 may include switch circuits 1215 and 1216. The third amplifier 1205 may include switch circuits 1225 and 1226. For example, the switch circuit 1101 of FIG. 11 may be implemented as the switch circuit 302 of FIG. 3B or the switch circuit 303 of FIG. 3C.

According to various embodiments, the power amplifier 1201 may be implemented as being the same as or similar to the power amplifier 801 of FIG. 8 except for further including the third amplifier 1205. Thus, the operation of the power amplifier 1201 may also be implemented as being the same as or similar to the operation of the power amplifier 801 of FIGS. 9 and 10 except for further including the third amplifier 1205.

According to various embodiments, the power amplifier 1201 may include a switch circuit in the third amplifier 1205 except for the switch circuits 1215 and 1216 in the second amplifier 1204, depending on a design.

Although FIGS. 8 through 12 illustrate a power amplifier including two or three amplifiers for convenience of description, the technical spirit of the present disclosure is not limited thereto and is also applicable to a power amplifier including a plurality of amplifiers. When the power amplifier includes a plurality of amplifiers corresponding to the power stage, a switch circuit may be included in at least one of the plurality of amplifiers.

Figure 13:
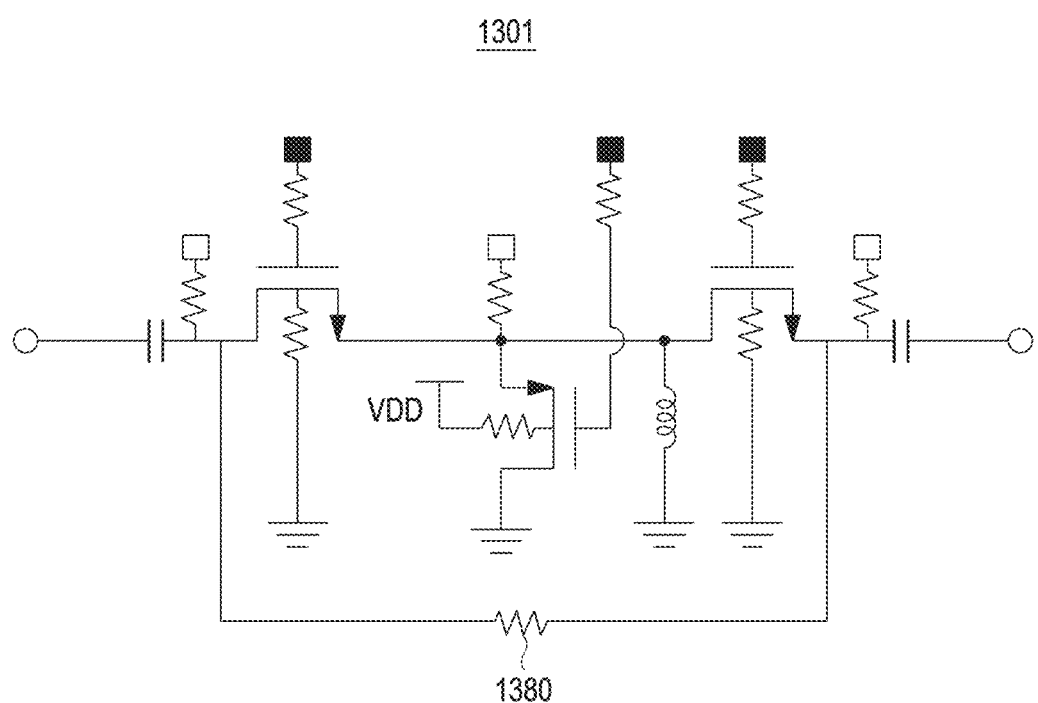
FIG. 13 is a diagram illustrating an example switch circuit included in a power amplifier, according to various embodiments.

FIG. 13 is a diagram illustrating an example switch circuit included in a power amplifier, according to various embodiments.

Referring to FIG. 13, a switch circuit 1301 may further include a resistor 1380 in the switch circuit 401 of FIG. 4A. For example, the resistor 1380 may be inserted as a shunt into the switch circuit 1301. For example, the resistor 1380 may be a shunt resistor.

According to various embodiments, the switch circuit 1301 may be applied to the power amplifier 1101 of FIG. 11. For example, the power amplifier 1101 may include an R-C (resistor-capacitor) feedback component of the amplifier of the power stage inside the switch circuit 1301. For example, the resistor 1380 may be a component corresponding to the R-C feedback of the amplifier of the power stage.

Although the switch circuit 1301 of FIG. 13 is shown as further including the resistor 1380 in the switch circuit 401, the switch circuit 1301 may further include a capacitor.

Figure 14:
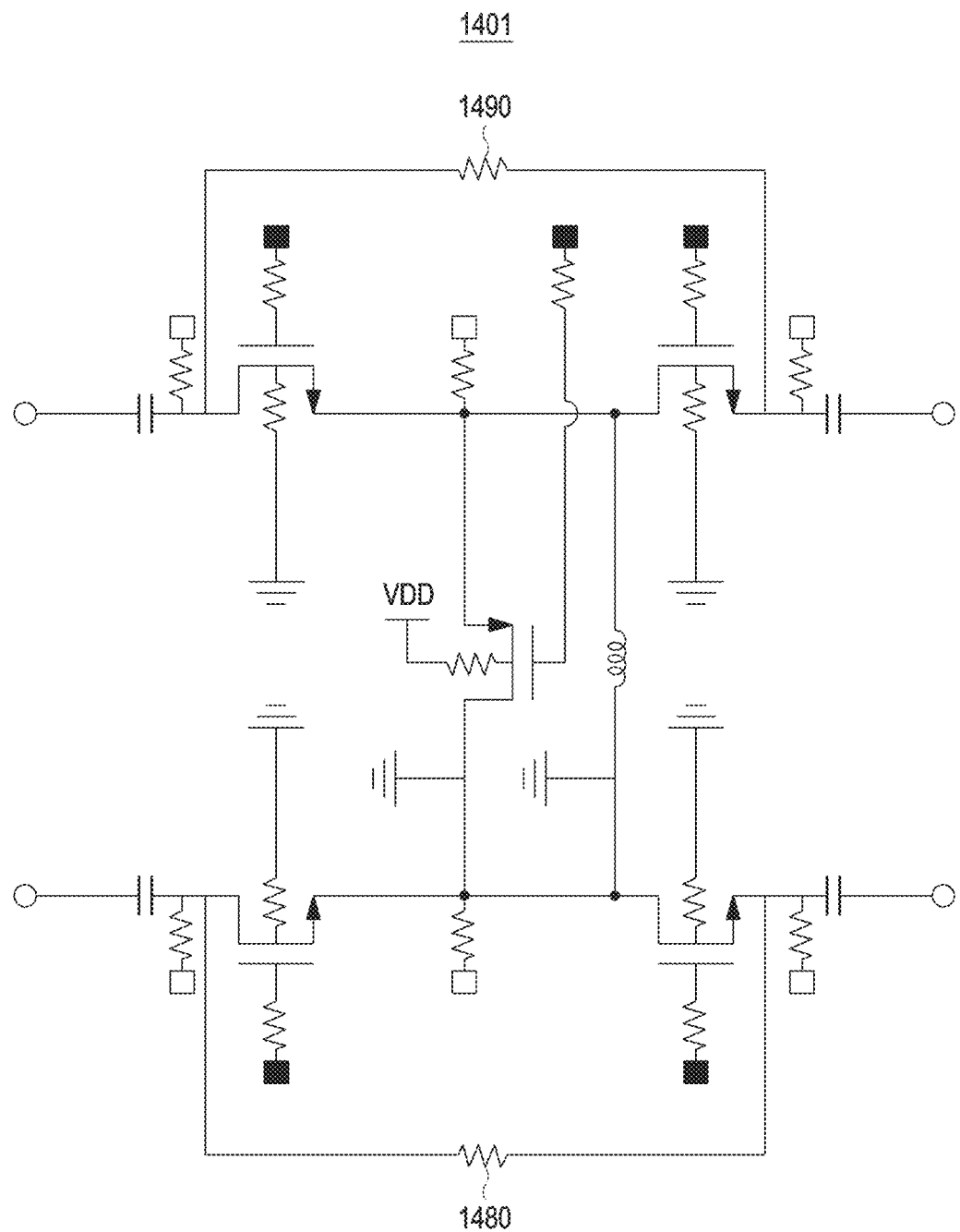
FIG. 14 is a diagram illustrating an example switch circuit included in a power amplifier, according to various embodiments.

FIG. 14 is a diagram illustrating an example switch circuit included in a power amplifier, according to various embodiments.

Referring to FIG. 14, a switch circuit 1401 may further include a first resistor 1480 and a second resistor 1490 in the switch circuit 601 of FIG. 6. For example, the first resistor 1480 and the second resistor 1490 may be inserted as shunts into the switch circuit 1401. For example, the first resistor 1480 and the second resistor 1490 may be shunt resistors.

According to various embodiments, the switch circuit 1401 may be applied to the power amplifier 801 of FIG. 8 or the power amplifier 1101 of FIG. 11. For example, the power amplifier 801 may include an R-C feedback component of the second amplifier 804 inside the switch circuit 1401. For example, the first resistor 1480 and the second resistor 1490 may be components corresponding to an R-C feedback of the second amplifier 804.

Although the switch circuit 1401 of FIG. 14 is shown as further including the first resistor 1480 and the second resistor 1490 in the switch circuit 601, the switch circuit 1401 may further include a capacitor.

An electronic circuit according to various embodiments includes a switch circuit, in which the switch circuit includes a first switch connected to a first port and a second switch connected to a second port, the first switch and the second switch being serially connected to each other, a first parallel switch connected to a node between the first switch and the second switch, and a first shunt inductor connected to the node to offset a parasitic capacitance component of the first parallel switch.

When the switch circuit is in a switch-on state, the first switch and the second switch may be turned on and the first parallel switch may be turned off, and when the switch circuit is in a switch-off state, the first switch and the second switch may be turned off and the first parallel switch may be turned on.

The first switch and the second switch may include, for example, and without limitation, n-channel metal-oxide semiconductor (NMOS) transistors, and the first parallel switch may include, for example, and without limitation, a p-channel metal-oxide semiconductor (PMOS) transistor.

Each of the first switch and the second switch may include a decoupling capacitor, and a capacitance value of the decoupling capacitor and an inductance value of the first shunt inductor may be adjusted for radio frequency (RF) signal matching.

The electronic device may further include a second switch circuit, in which the second switch circuit includes a third switch connected to a third port and a fourth switch connected to a fourth port, the third switch and the fourth switch being serially connected to each other, a second parallel switch connected to a node between the third switch and the fourth switch, and a second shunt inductor connected to the node to offset a parasitic capacitance component of the second parallel switch, the second parallel switch being serially connected to the first parallel switch and the second shunt inductor being serially connected to the first shunt inductor.

The first shunt inductor and the second shunt inductor may be implemented as one inductor.

When the second switch circuit is in a switch-on state, the third switch and the fourth switch may be turned on and the second parallel switch may be turned off, and when the second switch circuit is in a switch-off state, the third switch and the fourth switch may be turned off and the second parallel switch may be turned on.

The electronic device may further include a third switch circuit, in which the third switch circuit may include a third switch connected to a third port and a fourth switch connected to a fourth port, the third switch and the fourth switch being serially connected to each other, and the third switch circuit may be connected to the first parallel switch through a node between the third switch and the fourth switch and is connected to the first shunt inductor through the node.

When the third switch circuit is in a switch-on state, the third switch and the fourth switch may be turned on and the first parallel switch may be turned off, and when the third switch circuit is in a switch-off state, the third switch and the fourth switch may be turned off and the first parallel switch may be turned off.

A power amplifier according to various example embodiments includes: a first amplifier and a second amplifier including a switch circuit, wherein the second amplifier is configured to amplify a signal output from the first amplifier through the switch circuit in a first power mode of the power amplifier and to bypass the signal output from the first amplifier through the switch circuit in a second power mode of the power amplifier, and the switch circuit includes: a first switch connected to a first input terminal of the second amplifier and a second switch connected to a first output terminal of the second amplifier, the first switch and the second switch being serially connected to each other, a first parallel switch connected to a node between the first switch and the second switch, and a first shunt inductor connected to the node between the first switch and the second switch and configured to offset a parasitic capacitance component of the first parallel switch.

In the first power mode, the first switch and the second switch may be turned on and the first parallel switch may be turned off, and in the second power mode, the first switch and the second switch may be turned off and the first parallel switch may be turned on.

The first power mode may be a low power mode, and the second power mode may be a high power mode.

The switch circuit may further include a shunt resistor applied to both terminals of the first switch and the second switch.

The switch circuit may include: a third switch connected to a second input terminal of the second amplifier and a fourth switch connected to a second output terminal of the second amplifier, the third switch and the fourth switch being serially connected to each other, a second parallel switch connected to a node between the third switch and the fourth switch, and a second shunt inductor connected to the node between the third switch and the fourth switch and configured to offset a parasitic capacitance component of the second parallel switch, the second parallel switch being serially connected to the first parallel switch and the second shunt inductor being serially connected to the first shunt inductor.

In the first power mode, the third switch and the fourth switch may be turned on and the second parallel switch may be turned off, and in the second power mode, the third switch and the fourth switch may be turned off and the second parallel switch may be turned on.

The switch circuit may include a third switch connected to a second input terminal of the second amplifier and a fourth switch connected to a second output terminal of the second amplifier, the third switch and the fourth switch being serially connected to each other, and the third switch and the fourth switch may be connected to the first parallel switch through a node between the third switch and the fourth switch and may be connected to the first shunt inductor through the node between the third switch and the fourth switch.

The switch circuit may further include a first shunt resistor applied to both terminals of the first switch and the second switch, and a second shunt resistor applied to both terminals of the third switch and the fourth switch.

Each of the first switch and the second switch may include a decoupling capacitor, and a capacitance value of the decoupling capacitor and an inductance value of the first shunt inductor may be adjusted for RF signal matching.

The switch circuit may be positioned in a feedback path of the second amplifier.

In the first power mode, a drain voltage of the second amplifier may be maintained at a high state.

The electronic device according to various embodiments disclosed herein may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "$1^{st}$" and "$2^{nd}$," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 103 or 155) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. When distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents.

The invention claimed is:

1. An electronic circuit comprising:
 a first switch circuit, and
 a second switch circuit,
 wherein the first switch circuit comprises:
  a first switch connected to a first port and a second switch connected to a second port, the first switch and the second switch being serially connected to each other;
  a first parallel switch connected to a node between the first switch and the second switch;
  a first shunt inductor connected to the node between the first switch and the second switch and configured to offset a parasitic capacitance component of the first parallel switch,
 wherein the second switch circuit comprises:
  a third switch connected to a third port and a fourth switch connected to a fourth port, the third switch and the fourth switch being serially connected to each other;
  a second parallel switch connected to a node between the third switch and the fourth switch; and
  a second shunt inductor connected to the node between the third switch and the fourth switch and configured to offset a parasitic capacitance component of the second parallel switch,
  the second parallel switch being serially connected to the first parallel switch and the second shunt inductor being serially connected to the first shunt inductor.

2. The electronic device of claim 1, wherein based on the first switch circuit being in a switch-on state, the first switch and the second switch are turned on and the first parallel switch is turned off, and
 based on the first switch circuit being in a switch-off state, the first switch and the second switch are turned off and the first parallel switch is turned on.

3. The electronic device of claim 1, wherein the first switch and the second switch comprise n-channel metal-oxide semiconductor (NMOS) transistors, and the first parallel switch comprises a p-channel metal-oxide semiconductor (PMOS) transistor.

4. The electronic device of claim 1, wherein each of the first switch and the second switch comprise a decoupling capacitor, wherein a capacitance value of the decoupling capacitor and an inductance value of the first shunt inductor are adjusted for radio frequency (RF) signal matching.

5. The electronic device of claim 1, wherein the first shunt inductor and the second shunt inductor are implemented as one inductor.

6. The electronic device of claim 2, wherein based on the second switch circuit being in a switch-on state, the third switch and the fourth switch are turned on and the second parallel switch is turned off, and
 based on the second switch circuit being in a switch-off state, the third switch and the fourth switch are turned off and the second parallel switch is turned on.

7. An electronic circuit comprising:
 a first switch circuit, and
 a second switch circuit,
 wherein the first switch circuit comprises:
  a first switch connected to a first port and a second switch connected to a second port, the first switch and the second switch being serially connected to each other;
  a first parallel switch connected to a node between the first switch and the second switch;
  a first shunt inductor connected to the node between the first switch and the second switch and configured to offset a parasitic capacitance component of the first parallel switch,
  wherein the second switch circuit comprises a third switch connected to a third port and a fourth switch connected to a fourth port, the third switch and the fourth switch being serially connected to each other, and
   the second switch circuit is connected to the first parallel switch through a node between the third switch and the fourth switch and is connected to the first shunt inductor through the node between the third switch and the fourth switch.

8. The electronic device of claim 7, wherein based on the second switch circuit being in a switch-on state, the third switch and the fourth switch are turned on and the first parallel switch is turned off, and
 based on the second switch circuit being in a switch-off state, the third switch and the fourth switch are turned off and the first parallel switch is turned off.

9. A power amplifier comprising:
 a first amplifier; and
 a second amplifier comprising a switch circuit,
 wherein the second amplifier is configured to:
 amplify a signal output from the first amplifier through the switch circuit in a first power mode of the power amplifier; and
 bypass the signal output from the first amplifier through the switch circuit in a second power mode of the power amplifier, and
 the switch circuit comprises:
  a first switch connected to a first input terminal of the second amplifier and a second switch connected to a first output terminal of the second amplifier, the first switch and the second switch being serially connected to each other;
  a first parallel switch connected to a node between the first switch and the second switch; and
  a first shunt inductor connected to the node between the first switch and the second switch and configure to offset a parasitic capacitance component of the first parallel switch,
 wherein the switch circuit further comprises a shunt resistor applied to both terminals of the first switch and the second switch.

10. The power amplifier of claim 9, wherein in the first power mode, the first switch and the second switch are turned on and the first parallel switch is turned off, and
 in the second power mode, the first switch and the second switch are turned off and the first parallel switch is turned on.

11. The power amplifier of claim 9, wherein the first power mode comprises a low power mode, and the second power mode comprises a high power mode.

12. The power amplifier of claim 9, wherein the switch circuit comprises:
 a third switch connected to a second input terminal of the second amplifier and a fourth switch connected to a second output terminal of the second amplifier, the third switch and the fourth switch being serially connected to each other;
a second parallel switch connected to a node between the third switch and the fourth switch; and
a second shunt inductor connected to the node between the third switch and the fourth switch and configured to offset a parasitic capacitance component of the second parallel switch,
the second parallel switch being serially connected to the first parallel switch and the second shunt inductor being serially connected to the first shunt inductor.

13. The power amplifier of claim 12, wherein in the first power mode, the third switch and the fourth switch are turned on and the second parallel switch is turned off, and
in the second power mode, the third switch and the fourth switch are turned off and the second parallel switch is turned on.

* * * * *